United States Patent
Hassan

(10) Patent No.: US 12,363,319 B2
(45) Date of Patent: Jul. 15, 2025

(54) OBJECT-BASED CONTEXT-BASED DECODER CORRECTION

(71) Applicant: Microsoft Technology Licensing, LLC, Redmond, WA (US)

(72) Inventor: Amer Aref Hassan, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/209,902

(22) Filed: Jun. 14, 2023

(65) Prior Publication Data

US 2024/0422328 A1 Dec. 19, 2024

(51) Int. Cl.
| | |
|---|---|
| H04N 19/176 | (2014.01) |
| G06F 3/14 | (2006.01) |
| G06V 10/82 | (2022.01) |
| H04N 19/30 | (2014.01) |

(52) U.S. Cl.
CPC ............ *H04N 19/176* (2014.11); *G06F 3/14* (2013.01); *G06V 10/82* (2022.01); *H04N 19/30* (2014.11); *G06V 2201/07* (2022.01)

(58) Field of Classification Search
None
See application file for complete search history.

(56) References Cited

U.S. PATENT DOCUMENTS

| | | |
|---|---|---|
| 5,864,805 A | 1/1999 | Chen |
| 9,711,148 B1 | 7/2017 | Sharifi et al. |
| 10,236,031 B1 | 3/2019 | Gurijala |
| 2004/0205383 A1 | 10/2004 | Sawaguchi |
| 2007/0083374 A1 | 4/2007 | Bates et al. |

(Continued)

FOREIGN PATENT DOCUMENTS

CN 113271110 A 8/2021

OTHER PUBLICATIONS

Akmal Akmalkhodzhaev, "Joint decoding of turbo code and AMR-WB vocoder in 3GPP LTE system", 6th International Congress on Ultra Modern Telecommunications and Control Systems and Workshops (ICUMT)—IEEE, Oct. 6, 2014, pp. 402-406.

(Continued)

*Primary Examiner* — Rebecca A Volentine
(74) *Attorney, Agent, or Firm* — Schwegman Lundberg & Woessner, P.A.

(57) ABSTRACT

Disclosed in some examples are methods, systems, and machine-readable mediums for utilizing context information to create decoding feedback information to improve decoder accuracy and/or performance. In some examples, the context information is from layers of a network stack above the layers in which the decoders are present. The context information may be or be based upon information about previously received and decoded data and/or information about the sender to provide decoding feedback information to the decoder that is used either to correct a previous decoding error or to inform the decoder on which of a plurality of decoding choices is more likely to be correct. This may increase decoding performance by decreasing errors and in some examples, reducing the complexity of choices by eliminating certain decoding possibilities and thus increasing decoder efficiency.

20 Claims, 19 Drawing Sheets

(56) References Cited

U.S. PATENT DOCUMENTS

| | | |
|---|---|---|
| 2008/0059144 A1 | 3/2008 | Earhart |
| 2009/0106695 A1 | 4/2009 | Perry et al. |
| 2011/0202876 A1 | 8/2011 | Badger et al. |
| 2013/0289977 A1 | 10/2013 | Tanaka |
| 2014/0278418 A1 | 9/2014 | Chen |
| 2015/0006164 A1 | 1/2015 | Lu |
| 2017/0214413 A1 | 7/2017 | Wang |
| 2017/0244979 A1* | 8/2017 | Kumar ................. H04N 19/577 |
| 2018/0013868 A1 | 1/2018 | Lin |
| 2019/0042881 A1 | 2/2019 | Lopatka |
| 2019/0066713 A1 | 2/2019 | Mesgarani et al. |
| 2019/0221205 A1 | 7/2019 | Czyryba |
| 2020/0279570 A1 | 9/2020 | Nakayama |
| 2021/0044775 A1* | 2/2021 | Lee ........................ H04N 5/917 |
| 2021/0295149 A1 | 9/2021 | Muraoka |
| 2022/0165249 A1 | 5/2022 | Wu |
| 2022/0231700 A1 | 7/2022 | Zhang |
| 2022/0321149 A1 | 10/2022 | Dodgson |
| 2022/0383853 A1 | 12/2022 | Xu |
| 2023/0086832 A1 | 3/2023 | Tadesse |
| 2023/0119685 A1* | 4/2023 | Kim ..................... H04N 19/139 382/103 |
| 2023/0198663 A1 | 6/2023 | Stoica |
| 2023/0232026 A1* | 7/2023 | Kim ..................... G06V 10/761 |
| 2024/0127812 A1 | 4/2024 | Inbavaluthi |
| 2024/0303178 A1 | 9/2024 | Paquin |
| 2024/0419895 A1 | 12/2024 | Hassan |
| 2024/0420702 A1 | 12/2024 | Hassan |
| 2024/0420707 A1 | 12/2024 | Hassan |

OTHER PUBLICATIONS

International Search Report and Written Opinion received for PCT Application No. PCT/US2024/031329, Sep. 4, 2024, 17 pages.

Wankhede, et al., "Enhancing Biometric Speaker Recognition Through MFCC Feature Extraction and Polar Codes for Remote Application", IEEE Access, vol. 11, Nov. 14, 2023, pp. 133921-133930.

Zhao, et al., "Convolutional Neural Networks to Enhance Coded Speech", IEEE/ACM Transactions on Audio, Speech, and Language Processing, vol. 27, Issue 4, Apr. 2019, pp. 663-678.

International Search Report and Written Opinion received for PCT Application No. PCT/US2024/031328, Sep. 16, 2024, 15 pages.

International Search Report and Written Opinion received for PCT Application No. PCT/US2024/031337, Sep. 16, 2024, 16 pages.

International Search Report and Written Opinion received for PCT Application No. PCT/US2024/031340, Sep. 18, 2024, 17 pages.

Kurka, et al., "Successive Refinement of Images with Deep Joint Source-Channel Coding", IEEE 20th International Workshop on Signal Processing Advances in Wireless Communications (SPAWC), Jul. 2, 2019, pp. 1-5.

Lee, et al., "Deep Learning-Constructed Joint Transmission-Recognition for Internet of Things", IEEE Access, vol. 7, Jun. 5, 2019, pp. 76547-76561.

Li, et al., "Content-assisted file decoding for nonvolatile memories", Conference Record of the Forty Sixth Asilomar Conference on Signals, Systems and Computers (ASILOMAR)—IEEE, Nov. 4, 2012, pp. 937-941.

Liang, et al., "An Iterative BP-CNN Architecture for Channel Decoding", IEEE Journal of Selected Topics in Signal Processing, vol. 12, Issue 1, Jan. 15, 2018, pp. 144-159.

Luo, et al., "Error control coding combined with content recognition", 8th International Conference on Wireless Communications & Signal Processing (WCSP)—IEEE, Oct. 13, 2016, pp. 1-5.

Strinati, et al., "6G networks: Beyond Shannon towards semantic and goal-oriented communications", Computer Networks, vol. 190, May 8, 2021, pp. 1-17.

Sun, et al., "Deep Joint Source-Channel Coding for Wireless Image Transmission with Semantic Importance", IEEE 96th Vehicular Technology Conference (VTC2022-Fall), Sep. 26, 2022, pp. 1-7.

Yao, et al., "Semantic Coding for Text Transmission: An Iterative Design", IEEE Transactions on Cognitive Communications and Networking, vol. 8, Issue 4, Jul. 20, 2022, pp. 1594-1603.

Levow, Gina-Anne, "Characterizing and recognizing spoken corrections in human-computer dialogue", The 17th International Conference on Computational Linguistics, vol. 1, 1998, pp. 736-742.

Non-Final Office Action mailed on Mar. 27, 2025, in U.S. Appl. No. 18/209,920, 34 pages.

Non-Final Office Action mailed on May 15, 2025, in U.S. Appl. No. 18/209,909 12 Pages.

\* cited by examiner

OBJECT-BASED CONTEXT-BASED DECODER CORRECTION

TECHNICAL FIELD

Embodiments pertain to improving the performance of decoders that decode encoded data. Some embodiments relate to improving decoder performance using feedback data created based upon context information about the data that is being decoded.

BACKGROUND

Interference, multipath fading, and other effects may change data during its transmission or storage. To safeguard against these changes, computing systems commonly utilize one or more encoding schemes that apply one or more codes to the data prior to its transmission. The recipient device utilizes a corresponding decoding scheme to decode the data and to detect and/or correct errors introduced during transmission or storage of this data. In a similar fashion, a computing device may apply one or more codes to data prior to storage of the data in a data storage device. When reading this data from storage, the device applies the corresponding decoding scheme to decode the data and to detect and/or correct errors introduced from the storage of the data on, or the reading of the data from the storage medium. Example encoding schemes that allow both error detection and/or correction include convolutional codes, turbo codes, and the like.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
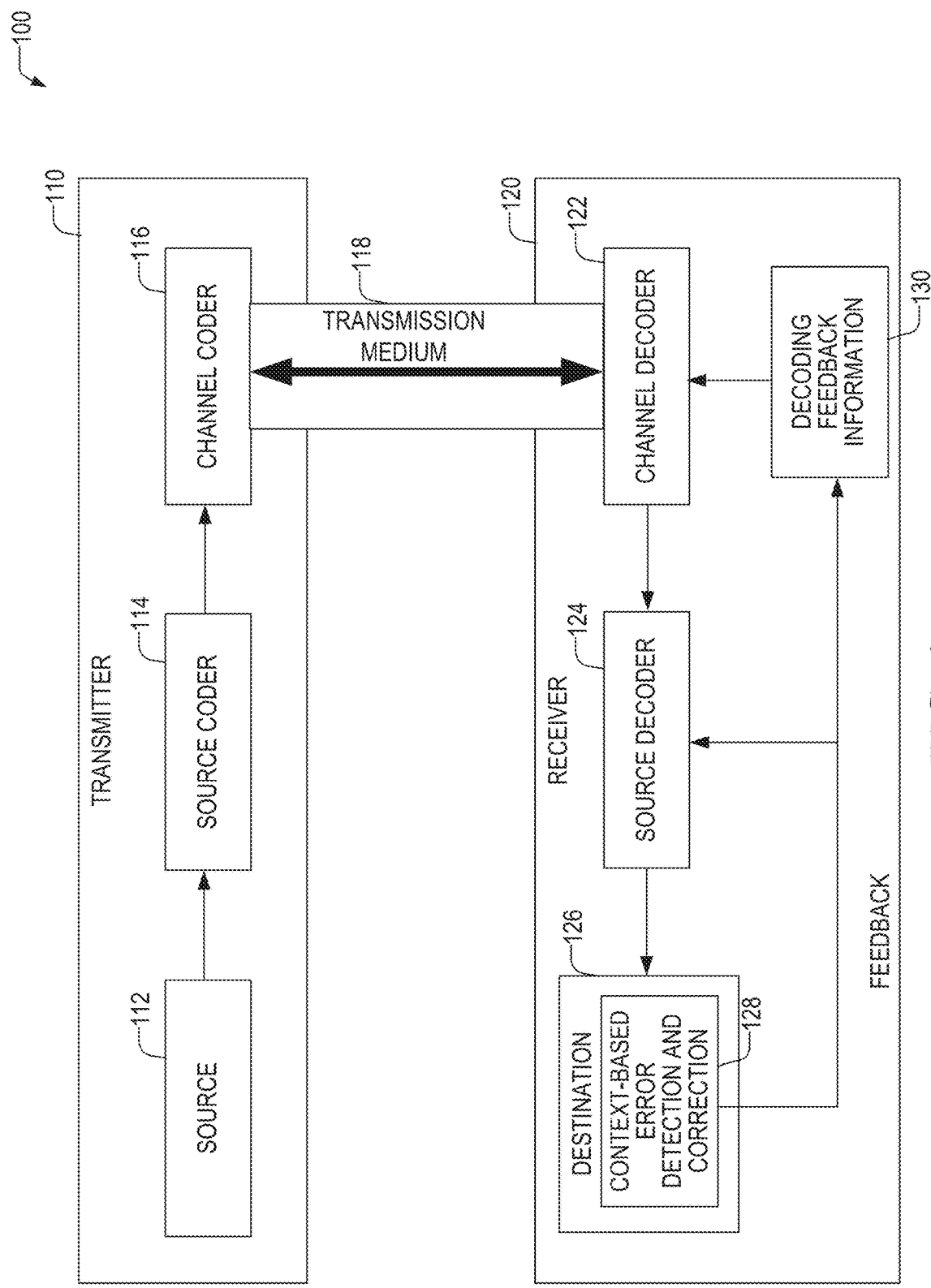
FIG. 1 illustrates a system according to some examples of the present disclosure.

Multiple different codes of one or more different types may be applied to data prior to transmission or storage, including source encoding and channel encoding. Source encoding may first process the raw data with a first code such as video codecs, audio codecs, compression schemes, and the like to create source encoded data. These source codes may include some error correction and/or detection. The source encoded data is then protected by a channel code applied by a channel encoder Example channel codes include forward error correction codes such as convolutional codes, turbo codes, Reed-Solomon codes, and the like. At the receiver, the received data is first decoded with a channel decoder that corresponds to the channel encoder. The output of the channel decoder is then source decoded where it is decoded using a source decoder that corresponds to the source encoder into application data. The application data may be one or more of: processed more by an application, output to the user, or stored on a storage device.

A channel code generally maps a sequence of n bits or symbols to another sequence of y coded bits or symbols where y>n. For example, a source encoded bit sequence of four bits of: 0101 may be channel coded by mapping that sequence to twelve bits: 001111011110 using a codebook to create channel coded data. The channel coded data may then be transmitted over the communication medium or stored on a storage device. If one or more bits are changed, the original data may be recovered by choosing the code from the codebook that is closest to the received data. That is, the codeword with the lowest Hamming distance to the received bit sequence is chosen. If the codes are chosen carefully, each possible bit change has a clear most likely codeword. The channel coding essential trades throughput for accuracy. While channel coding works very well, if the channel suffers from multiple errors, the proper decoding may be more difficult to properly discern. That is, the distances may be such that multiple decoding possibilities are the closest to the received data. In addition, the channel coder has a memory in that errors in decoding of one sequence may affect later sequences.

Traditional codes operate independent of the knowledge of what type of data that they are coding. That is, the coding and encoding schemes only consider the received sequences of ones and/or zeros and the mapping between those sequences and the decoded sequences. For example, some channel decoders make decisions between two or more possible decoded bit sequences based upon one or more metrics such as probabilities or distances. Examples include a state cost and an overall path cost for a Viterbi decoder where any particular state transition in the decoder has a cost and the total cost of all state transitions for a path through the decoder is a path cost. In other decoders, such as turbo decoders, two different decoders generate a hypothesis with derived likelihoods for the pattern of bits in the payload. The hypothesis bit-patterns are compared, and if they differ, a bit-by-bit comparison is done and each decoder then incorporates the likelihood estimates from the other decoder to form a new hypothesis. This cycle continues until the decoders come up with the same hypothesis. This may last 15 to 18 cycles. In either case, because previous decisions of the decoders affect subsequent decisions, a decoder may be said to have a "memory."

The inventor of the present disclosure has recognized that upper layers, such as application layers, have context data that may be utilized in a modified channel decoder to decode data more accurately by correcting the decoder's memory and/or to decode data faster. This context data may be based upon what the data represents and may be used by the decoder to select from a plurality of potential bit streams (e.g., to update a likelihood of a certain decoding); update path costs; prune one or more wrong decisions from a decision trellis; or the like. The context information may be used to improve an initial decoding of data, and/or may be used to improve the decoding of subsequent data.

As an example, if a text message is being transmitted with the text: "tasty sea salt," and it's received as "tasty see salt," at the receiver, the application layer may utilize context information of the surrounding words to correct the word "see" to "sea." This context information, in the form of decoding feedback information, may then be fed back to the decoder to prune a trellis, update path costs, or the like to better decode future data. The decoding feedback information may be the corrected data (e.g., the word "sea") that should have been received (e.g., the word "sea" source and channel coded). As another example, information on a word distribution of previous messages of a sender may be provided to a decoder as a decoding feedback information to inform the decision of which of two possible decodings are more likely. This may be used by, for example, a turbo decoder to adjust the probabilities of each choice to bias the probabilities toward a bit sequence representing a word that is more commonly used by the sender. This word distribution information may also be used to, for example, increase or decrease one or more path costs of a Viterbi decoder such that the decoder is more likely to choose words that are more frequently used by a sender.

Disclosed in some examples are methods, systems, and machine-readable mediums for utilizing context information to create decoding feedback information to improve decoder accuracy and/or performance. In some examples, the context information is from layers of a network stack above the layers in which the decoders are present. The context information may be or be based upon information about previously received and decoded data and/or information about the sender to provide decoding feedback information to the decoder that is used either to correct a previous decoding error or to inform the decoder on which of a plurality of decoding choices is more likely to be correct. This may increase decoding performance by decreasing errors and in some examples, reducing the complexity of choices by eliminating certain decoding possibilities and thus increasing decoder efficiency.

The decoding feedback information may be information, other than the incoming channel encoded data, that may be used by the channel decoder to assist the decoder in determining a current or future decoding. In some examples, the decoder is a channel decoder, but in other examples a source decoder may also benefit from such context information. The disclosure used herein provides numerous examples of the use of context information to assist in channel decoder performance. A person of ordinary skill in the art with the benefit of the present disclosure will understand that the same techniques may be applied to source decoding.

Decoding feedback information may be created from contextual information which may be based upon previously decoded data, previous historical communication data, or the like. The decoding feedback information may be created as a natural result of processing received data for use, e.g., in an application, and in other examples, the decoding feedback information may be created specifically for use to assist the decoder. In some examples, the decoding feedback information may directly be the context information, but in other examples, the decoding feedback information may be created based upon the context information, such as source and/or channel encoded context information. The feedback information, as previously noted, may be examples of incorrect decoder choices and may provide a corrected choice or may be information on which of a number of possible decoding choices is more likely.

Examples of context information may vary depending on the data that is being decoded. For textual data, such as instant or text messaging, the context information may include spell corrected text from a message or document that is being transmitted. The spell checking may use context-sensitive spell checking that may determine that words are misspelled from a dictionary and from the surrounding context to detect that an incorrect version of a word is used (e.g., "see" instead of "sea"). Other context information may include grammar checking. In still other examples, the system may determine a probability distribution of a sender's word choice. For example, users may have a limited vocabulary and may use some words more often than others. This probability distribution may be used by the spelling or grammar checker to determine a most probable word. In some other examples, the context information may be predictive text. For example, text messaging applications frequently utilize predictive text to predict what a sender wants to say next given an initial seed phrase consisting of one or more words. In the present disclosure the predictive text may be used to predict the next likely decoder output. That is, the decoder may decode one or more seed phrases and the receiver may predict a next word or phrase. In some examples, the predictive text may also utilize the specific sender's word or phrase probability distribution. For improving the performance of channel decoding, in some examples, the context information, such as the corrected text, may be source encoded and/or channel encoded to produce the feedback information. This feedback information is then used by the decoder as described herein.

For voice data, speakers have unique voice characteristics. In some examples the voice characteristics may be pitch, frequency, amplitude, or the like. Voice characteristics in some examples may include Mel Frequency Cepstral Coefficient (MFCC) data. For voice communication applications, a speaker may be identified, and received audio is compared to voice characteristics of the speaker. The output of the audio codec may be compared to the stored voice characteristics to determine if the output audio is within the voice characteristics of the speaker. If the output audio is not within the voice characteristics of the speaker, the decoder may have erroneously decoded one or more bits. In these examples, the decoder feedback information may be an indication of which portions were not within the voice characteristics. In these examples, the decoder may utilize this information to re-calculate the path metrics by increasing path metrics for those segments to re-balance future decisions. For example, the path metrics of the chosen decoding may be increased by a number that may be based upon how far from the voice characteristics of the speaker the decoded speech was. In other examples, the decoded speech may be corrected so as to be within the voice characteristics of the speaker and this may be used as feedback to the decoder to correct the decoder's path costs or probabilities.

In other examples, the decoder may output a plurality of decoding possibilities (e.g., the 10 most likely decodings) and each may be further source decoded and compared to the voice characteristics. The decoding that is closest to the voice characteristics may be chosen. This decoding may be output to the user and/or the choice may be fed back to the decoder for decoding future data. In other examples, the decoded voice data may be automatically transcribed. The transcription may be treated as textual input as per the above text context and corrected using spelling and grammar changes. The transcribed and corrected text may then be input to a text-to-speech AI algorithm that uses the voice characteristics of the user to generate simulated user speech. The simulated speech may then be used by the decoder to correct the decoding of the real audio as previously explained. In still other examples, the predictive text may be used on the transcript to predict future words of the user. These predicted utterances of the user may then be input to a text-to-speech AI algorithm that uses the voice characteristics of the user to generate simulated speech. The simulated speech may then be used by the decoder to decode future real speech by informing the decoder on the probabilities of various decoding possibilities.

For video applications, the system may utilize artificial intelligence to detect one or more objects in the video frames. If the object detection is not reliable, an object that the system was expected is not detected, or a detected object has errors, the system may use this information to determine feedback information for a decoder. For example, a deep learning neural network may regenerate the image using information about what was wrong in the image or what was not detected. This data may then serve as the feedback information to the decoder (e.g., after being encoded). In still other examples, a decoder may output a plurality of possible decodings and the decoding selected may be the one where the object detector most accurately identifies one or more expected objects. The selected decoding may be output to the user and the choice of which decoding is correct may be fed back to the decoder for use in decoding subsequent data. The object detection done to multiple decoding possibilities may be done in parallel. In some examples, video data may be encoded such that a base encoding layer may be sent and additional encoding layers that encode enhancements in size, bitrate, or quality may be sent in addition if network conditions and/or processing capabilities are sufficient. In some examples, when object detection is unreliable the system may request additional encoding layers that provide additional details to assist with encoding.

In some examples, the upper layers may continuously provide decoding feedback, but in other examples, the channel decoder may set one or more flags that the channel is noisy (e.g., based upon a number of bit errors exceeding a threshold). In these examples, the flag may trigger higher layers to provide the decoding feedback information, such as the comparison of received audio to the voice profile. In other examples, the flag may allow a media CODEC to make the decision to use interpolation instead of the literal bits delivered by the Channel Decoder. For example, by passing the digital samples through a low pass filter matched to a voice of a user.

As noted, the channel decoder may utilize the decoding feedback information to assist with decoding. For example, in a Viterbi decoder, the path metrics used to select various decoding possibilities may be adjusted based upon the decoding feedback information. A penalty may be added to decoding paths that do not correspond to decodings that correspond with the feedback information or to past paths that do not correspond to feedback information. Additionally, or instead of adding a penalty to paths not corresponding to the decoding feedback information, a reduction in path cost may be made to decoding paths that correspond to the decoding feedback information. For turbo codes, the probability metrics of various decoding possibilities may be adjusted similarly. In some examples, the amount of the penalty or path reduction or the amount the probability metrics are adjusted may be based upon the feedback information. For example, for the word frequency distribution feedback, the amount a path is adjusted may be based upon the frequency with which a sender utilizes a particular word. Thus a word used very frequently may have a path cost corresponding to that word lowered more than a word used less frequently.

As also noted, the decoding feedback information may correct a current state—e.g., to change, or redo a state transition that resulted in the decoder being in an incorrect state, or the decoding feedback information may be used by the decoder to prune one or more incorrect paths. For example, a Viterbi decoder utilizes a trellis that includes valid state transitions based upon a current state. The set of valid transitions may be reduced—e.g., the trellis may be trimmed-based upon the context information. This allows for faster and more accurate decoding. In some examples, the decoder may have a buffer. That is, the state of the decoder may be buffered, and when a decoding feedback information indicates an error, the state may be replayed to the point of the error with the decoder taking the correct path (e.g., through the trellis) on the second iteration.

As can be appreciated the present disclosure solves technical problems of accurately decoding data which may have errors because of transmission over an unreliable communication channel or which may have been stored in an unreliable storage device by utilizing the technical solution of providing decoding feedback information to the decoder from higher layers to allow the decoder to make more accurate decisions and in some examples to bypass one or more states. This has the technical effect of improving the functioning of the computing system by reducing errors and increasing decoder efficiency. This improves the functioning of the computer system by more accurately decoding data. This may reduce network usage and congestion by reducing retransmissions of packets received erroneously; may decrease a processing time needed to decode data (thus decreasing power consumption); and may increase decoding accuracy.

FIG. 1 illustrates a system 100 according to some examples of the present disclosure. A transmitter 110 has a data source 112. Data source 112 may be any application that produces data for storage or transmission. One example data source 112 may be a communication application which provides one or more network-based communication modalities such as voice, video, text, screen sharing, file sharing, or the like. Example communication applications include Microsoft Teams®, Skype®, Edge®, and the like. Example transmitters 110 may include computing devices such as desktop computing devices, laptop computing devices, tablets, phones, and the like. The data from the data source 112, may be sent to a source coder 114. Source coder 114 may apply one or more codecs, such as voice codecs, video codecs, or the like. In other examples, source coder 114 may apply compression schemes, or the like. In some examples, a source coder 114 may not be used. In some examples, the source coder 114 may be part of the data source 112.

Source encoded data is then passed to a channel coder 116. Channel coder 116 may apply one or more codes, such as forward error correction codes. Example forward error correction codes may include block codes, convolutional codes, and Turbo codes. Example block codes may include Reed-Solomon codes, Golay, BCH, Hamming Codes, Multidimensional parity, and the like. Example turbo codes include the parallel concatenated convolutional code (PCCC), serial concatenated convolutional codes, repeat-accumulate codes, and the like. The channel coded data is then modulated and sent over the transmission medium 118. Transmission medium 118 may be a Radio Frequency medium, such as an RF channel, a fiber optic, or the like. In some examples, the channel coded data may then be stored on a storage medium such as magnetic, optical, or solid-state storage.

Signals sent by the transmitter 110 are received by the receiver 120 and demodulated. The demodulated data is then processed by a channel decoder 122 that decodes the channel code. The channel decoder 122 may be an iterative channel decoder. For example, a Viterbi decoder. Channel decoder 122 may pass the decoded information to the source decoder 124 which may perform the reverse of the source coding 114. The decoded data is then passed to the destination application 126. For example, a communication application. The data may then be displayed, played, or otherwise conveyed to the user.

In some examples, the application may have a context-based error detection and correction component 128. The context-based error detection and correction component 128 may provide decoding feedback information 130 back to the channel decoder 122 based upon the context of the data. Channel decoder may utilize the decoding feedback information 130 to improve decoding performance by ensuring that the channel decoder is in a correct state, by trimming the trellis, by adjusting path or state weights, by adjusting probabilities such as adjusting a derived bit likelihood of a hypothesis or the like. In other examples, such as where the destination application 126 is storage on a disk, the channel decoder 122 may re-decode the information that was corrected to ensure the rest of the decoded data is correct and to ensure that the decoder state is correct. In still other examples, the source decoder may output multiple decoding guesses and the context-based error detection and correction component 128 may choose the most likely decoding possibility. This choice may then be fed back to the channel decoder.

In some examples, the context-based error detection and correction component 128 may provide context information such as word distribution frequency—which may be source encoded and/or channel encoded to create the decoding feedback information 130. In other examples, the context-based error detection and correction component 128 may provide corrected data as the decoding feedback information 130—which may be source encoded and/or channel encoded. For example, the context-based error detection and correction component may utilize a spell checker (which may or may not use surrounding word and/or conversation context), grammar checker, word probability distribution for the sender, voice profile comparison, voice transcript checking, video object detection, and the like to create the decoding feedback information. In some examples, the context-based error detection and correction component 128 may correct the data, such as by changing the text, changing the pixels of an image to match a detected object or a previous frame, updating the audio data to match a voice characteristic, and the like. This corrected data may be re-encoded with the source encoding and/or the channel encoding prior to being used by the decoder.

Text-Based Decoding

Figure 2:
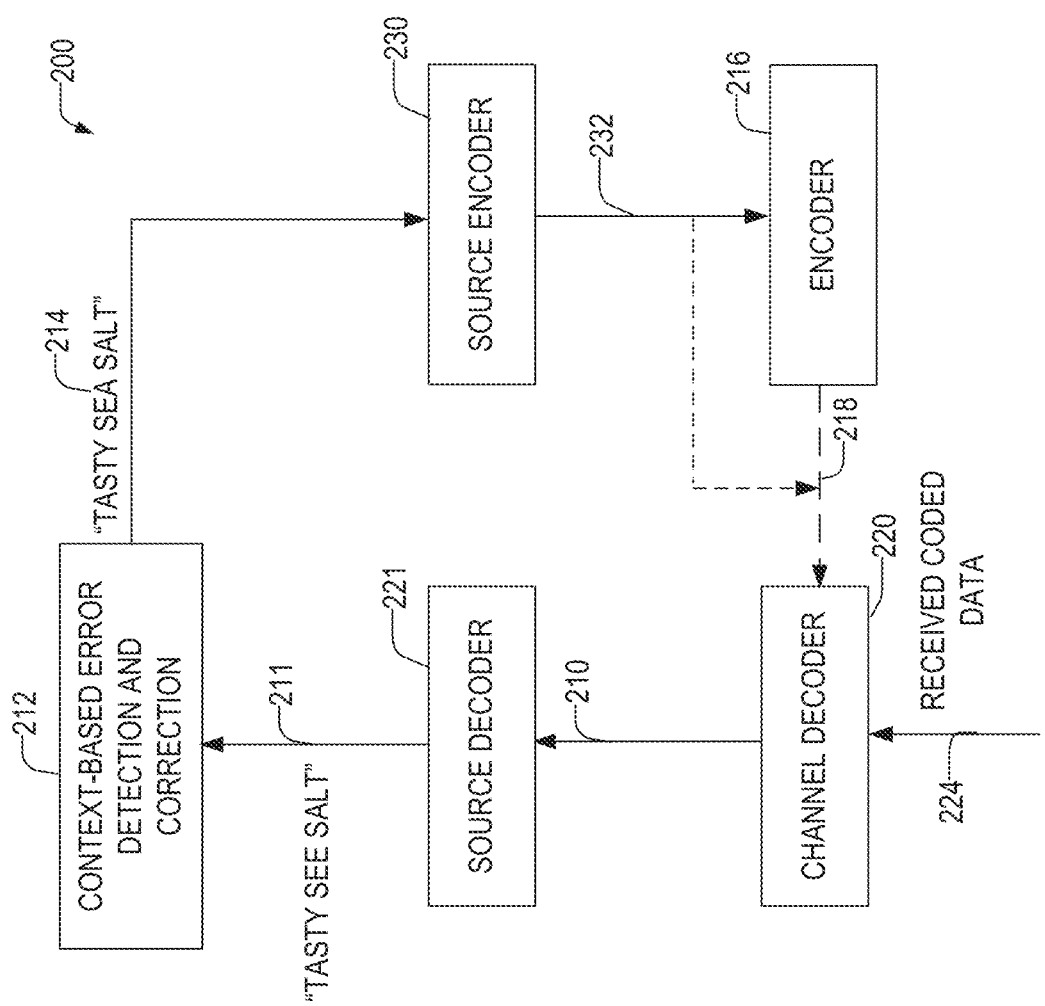
FIG. 2 illustrate use of textual context information to determine decoding feedback information to improve the performance of a decoder according to some examples of the present disclosure.

FIG. 2 illustrate use of textual context information to determine decoding feedback information to improve the performance of a decoder according to some examples of the present disclosure. Received coded data 224 is input into the channel decoder 220. The coded data 224 may be received from a storage device or from a transmission source. Binary data 210 is then output, which is processed by the source decoder 221 to produce the phrase: "Tasty see salt" 211 which is then passed to higher layers, including a context-based error detection and correction component 212. Context-based error detection and correction component 212 may correct the word "see" to "sea" as it recognizes that the word "see" is not appropriate given the context that the phrase appears to be talking about salt. Context-based error detection and correction component 212 may utilize spelling and/or grammar corrections. The spelling and/or grammar corrections may also, in some examples, utilize a word frequency distribution of the sender to more accurate correct phrases or grammar.

This corrected phrase, "tasty sea salt" 214 may then, in some examples, be source encoded by a source encoder 230 to produce source encoded data 232. The source encoding may be the same source encoding applied to the data that the source decoder 221 decodes. The source encoded data 232 may then be passed to the channel decoder directly as the feedback information 218, or may be first channel encoded by the channel encoder 216. Channel encoder 216 may apply the same channel code that the channel decoder 220 is decoding.

Channel decoder 220 may utilize the feedback information to process subsequent received coded data 224. For example, channel decoder 220 may utilize the feedback information to prune a decision trellis; update state or path costs; or the like. Channel decoder 220 may utilize decoding feedback as an indication of what the previously decoded data should have been and utilize that to correct the decoder state. Channel decoder 220 may utilize channel encoded feedback information to recalculate state and path costs, modify decoding probabilities, and/or to trim the trellis. The channel decoder 220 may utilize non-channel encoded feedback information in a similar fashion except now the feedback information tells the channel decoder 220 what the decoding should have been. This may also be used to update the path and state costs and/or trim the trellis. By trimming the trellis, the decision space may be reduced, thus increasing the computational performance of the decoder and decreasing an error rate. By updating state and path costs, the error rate may be reduced.

Figure 3:
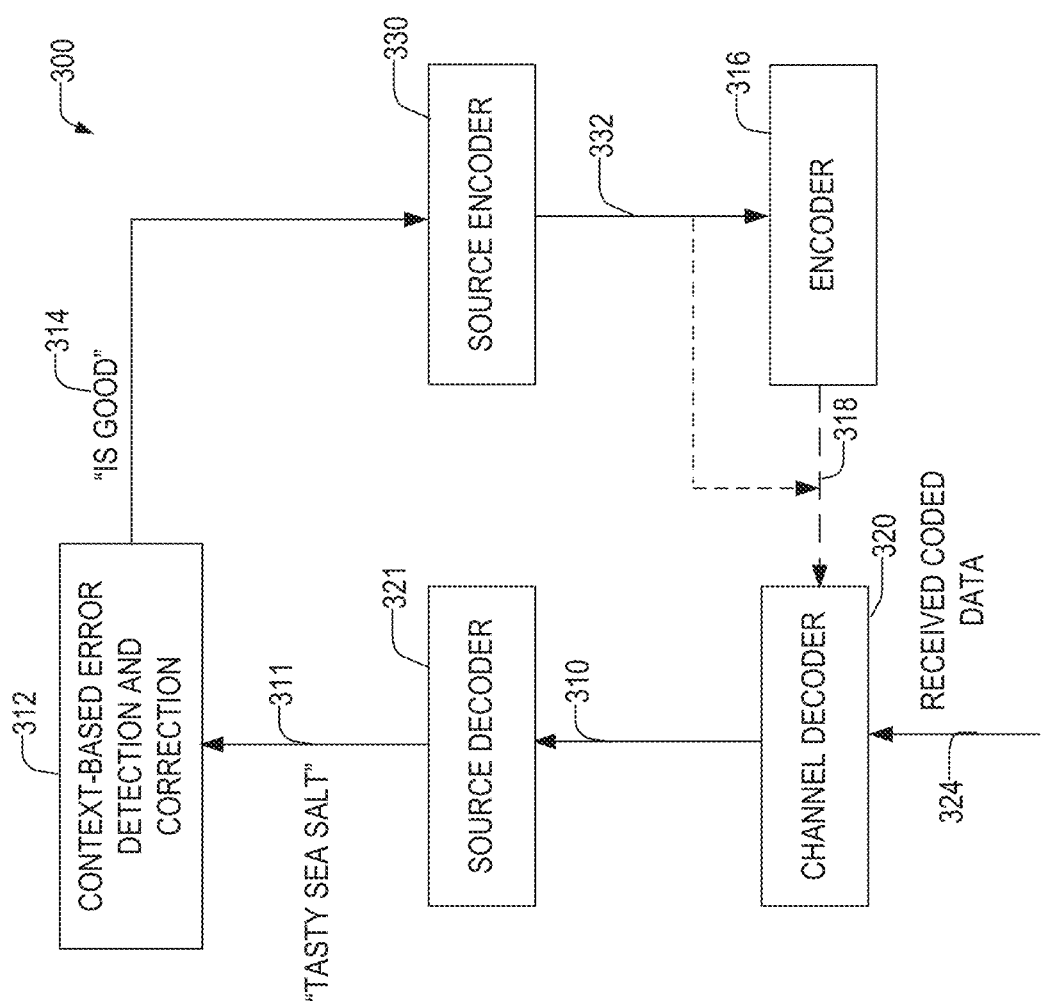
FIG. 3 illustrate use of textual context information to determine decoding feedback information to improve the performance of a decoder according to some examples of the present disclosure.

FIG. 3 illustrate use of textual context information to determine decoding feedback information to improve the performance of a decoder according to some examples of the present disclosure. Whereas FIG. 2 utilized corrections to previously decoded information, FIG. 3 utilizes predictive text information to predict what the next data is likely to be. Received coded data 324 is input into the channel decoder 320. The coded data 324 may be received from a storage device or from a transmission source. Binary data 310 is then output, which is processed by the source decoder 321 to produce the phrase: "Tasty sea salt" 311 which is then passed to higher layers, including a context-based error detection and correction component 312. Given the context of the phrase "Tasty Sea Salt," and/or other data such as previous messages in the conversation, word frequency history database of the sender, and the like, the context-based error detection and correction component 312 may deduce that the next phrase may be "is good" 314.

This predicted next phrase, "is good" 314 may then, in some examples, be source encoded by a source encoder 330 to produce source encoded data 332. The source encoding may be the same source encoding applied to the data that the source decoder 321 decodes. The source encoded data 332 may then be passed to the channel decoder directly as the feedback information 318 or may be first channel encoded by the channel encoder 316. Channel encoder 316 may apply the same channel code that the channel decoder 320 is decoding.

Channel decoder 320 may utilize the feedback information to process subsequent received coded data 324. For example, channel decoder 320 may utilize the feedback information to prune a decision trellis for the subsequent data; weight state or path costs that correspond to the predicted next phrase; or the like. Utilizing the decoding feedback information in this way improves the speed and accuracy of the decoder using data prediction techniques. Decoding possibilities that correspond to the predicted text may be boosted through lowering of path costs (or the subsequent increasing of path costs for possibilities that do not correspond to the predicted text) which may increase the decoder speed and/or accuracy. While a single predictive result is shown, in some other examples, a list of predicted next phrases may be utilized. Each of these may be processed in a same way by the decoder.

As noted, the context-based error detection and correction may utilize a spelling and/or grammar correction. The spelling and/or grammar correction may be based upon a dictionary or other rule set that identifies misspellings and/or grammar errors and provides corrections. In some examples, the spelling and/or grammar correction may employ morphological analysis to consider different forms of a same word and handle correctly spelled words that are not used properly (e.g., "see" instead of "sea"). The spell checker may use approximate string-matching algorithms, such as Levenshtein distance to find a correct spelling of misspelled words; clustering algorithms, n-gram based approaches; or the like. The spell checker and/or grammar checker may be context sensitive. For example, a machine-learning based winnow-based spelling correction algorithm Grammar checking algorithms may include Natural Language Processing (NLP) algorithms, part-of-speech tagging with rules based upon regular expressions, and the like.

Figure 4:
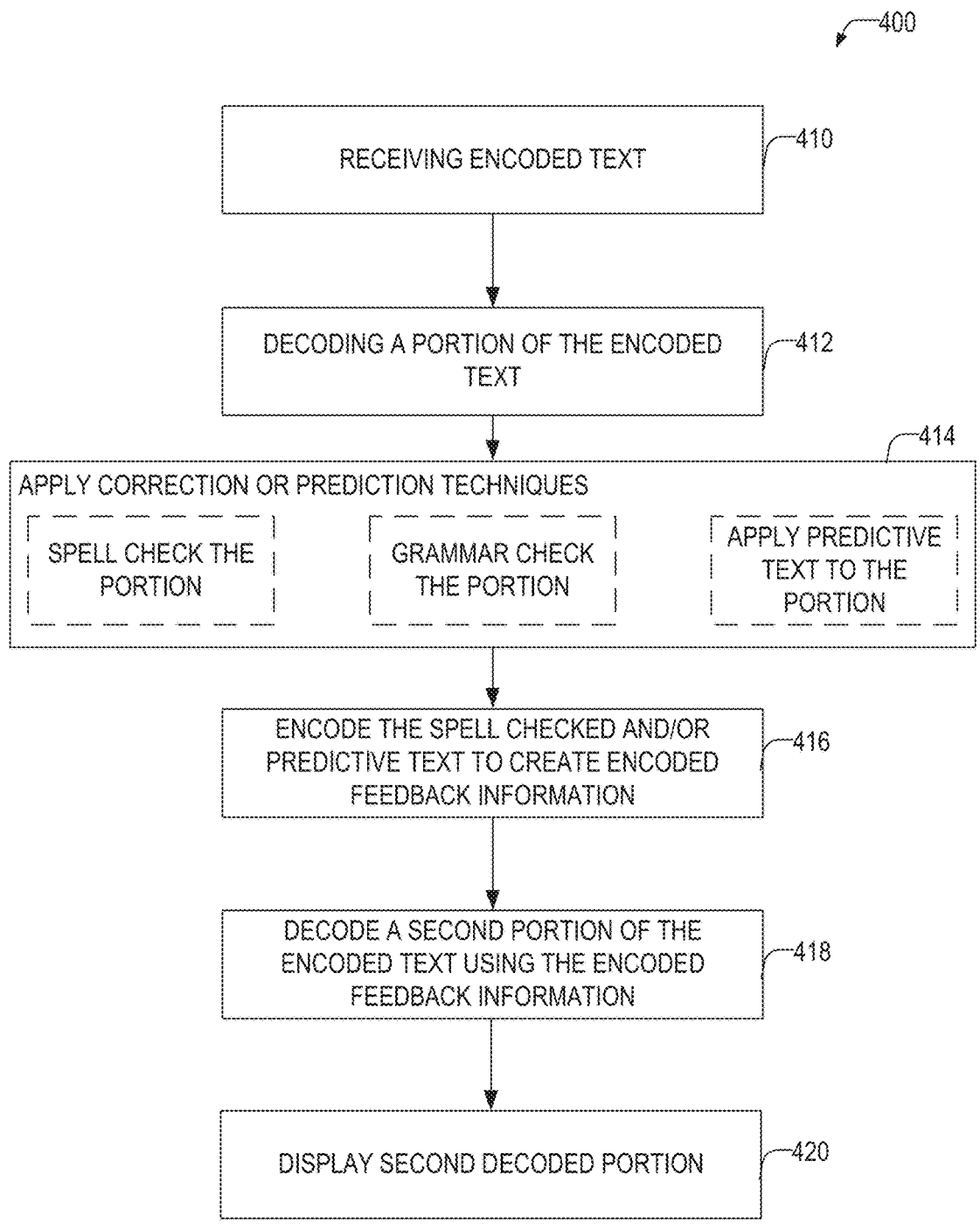
FIG. 4 illustrates a flowchart of a method 400 of improving decoder performance using textual context information according to some examples of the present disclosure.

FIG. 4 illustrates a flowchart of a method 400 of improving decoder performance using textual context information according to some examples of the present disclosure. At operation 410, a computing device receives encoded text. For example, the encoded text may be received over a communications channel of a transmission medium, such as part of a communication session, or may be loaded from storage. The transmission medium may be wired, wireless, or other mediums such as through RF, optical, electrical, or other mediums. In some examples, a transmission medium may include an internal system bus, and the data may be received from storage.

At operation 412, at least a portion of the encoded text is decoded to produce a decoded text portion. The decoder may be a channel decoder and/or a source decoder such as a Viterbi decoder and/or a turbo decoder.

At operation 414 the computing device applies a correction or prediction technique, such as by running a language check (e.g., spell check and/or grammar check) on the decoded text portion to produce a corrected decoded text portion or running a predictive text generator, the predictive text generator generating subsequent text to produce a predicted decoded next text portion. In some examples, the spell check, grammar check, or text prediction utilizes context information to correct the spelling, grammar, or predict the next text portion. The context information may include previous text sent by the sender in the present communication session, text sent by the sender in other communication sessions, word frequency distributions of the sender, and the like. The communication sessions may include network-based communication sessions such as network-based meetings, chats, emails, and the like.

At operation 416, the computing device may encode (either source coding or channel coding or both) the corrected decoded text portion or the predicted decoded next text portion to produce encoded feedback information.

At operation 418, the computing device decodes a second portion of the encoded text using the encoded feedback information. For example, by utilizing the corrected text, the decoder may update the state and/or encoded path costs. In other examples, in addition to, or instead of updating the encoded path costs, one or more branches of a decoding trellis may be updated. In still other examples, in the case of a turbo decoder, the probabilities of one or more of the plurality of outputs may be biased by a weighting factor indicating whether that output corresponded to the correct, or incorrect previous output. That is, if there are two outputs for the decoding at operation 412, a first output which corresponded to the original decoding and a second output which corresponded to the corrected decoding, the first output may have the probability associated with the output of the decoding of the second portion negatively modified (e.g., reduced) whereas the second output may have the probability associated with the output of the decoding of the second portion positively modified (e.g., increased). This reflects the fact that channel conditions may vary over time but change more slowly than the data rate. That is, a first portion of data is likely to be modified in a same way as a second portion of data transmitted right after the first portion. At operation 420, the system may output the second decoded text portion, e.g., to a display.

Voice-Based Decoding

If the data being sent is voice data, the system may utilize one or more voice characteristics of one or more speakers to determine that the speaker's voice pattern does not match or otherwise correspond to their expected characteristic. For example, vocal characteristics such as frequency, amplitude, pitch, timber, or the like are either a threshold distance too high or too low. In some examples, the voice characteristics may be MFCCs which are representations of the short-term power spectrum of the speakers that are based on a linear cosine transform of a log power spectrum on a nonlinear mel scale of frequency. In response to determining that the voice data of the speaker does not match one or more of the expected characteristics of the speaker's voice, the system may generate decoding hints in a variety of ways.

For example, the system may apply one or more correction algorithms to the speech data to correct the speech data such that the speech data does match the characteristic of the speaker. For example, pitch correction, cadence correction, or the like. This corrected data may then be used as the decoding feedback information to assist the decoder. This corrected data may be encoded in a source and/or a channel decoder and then used by the channel decoder as described herein.

In another example, the decoder may be modified to output a plurality of candidate decodings. That is, the top N probable decoding possibilities may be output. For example, the N decoding possibilities with the lowest path scores; the N decoding possibilities with the highest probabilities, or the like. Each of the decoding possibilities may be further source decoded and then checked against the one or more voice characteristics. These operations may be done in parallel. The decoding that most closely matches the one or more voice characteristics may be selected and output to the user. The feedback information may be the selection of which decoding was chosen. The decoder may then use that information as a decoding feedback information to update the decoder state as described herein.

In still other examples, the system may utilize transcription technology to transcribe the speech into text. The previously describe correction data for text may then be applied. A speech synthesis algorithm may be employed to generate voice data that sounds like the voice of the speaker. This synthetic speech data may then be encoded (e.g., either source and/or channel encoded) and used as feedback information to update the decoder state as described herein.

Figure 5:
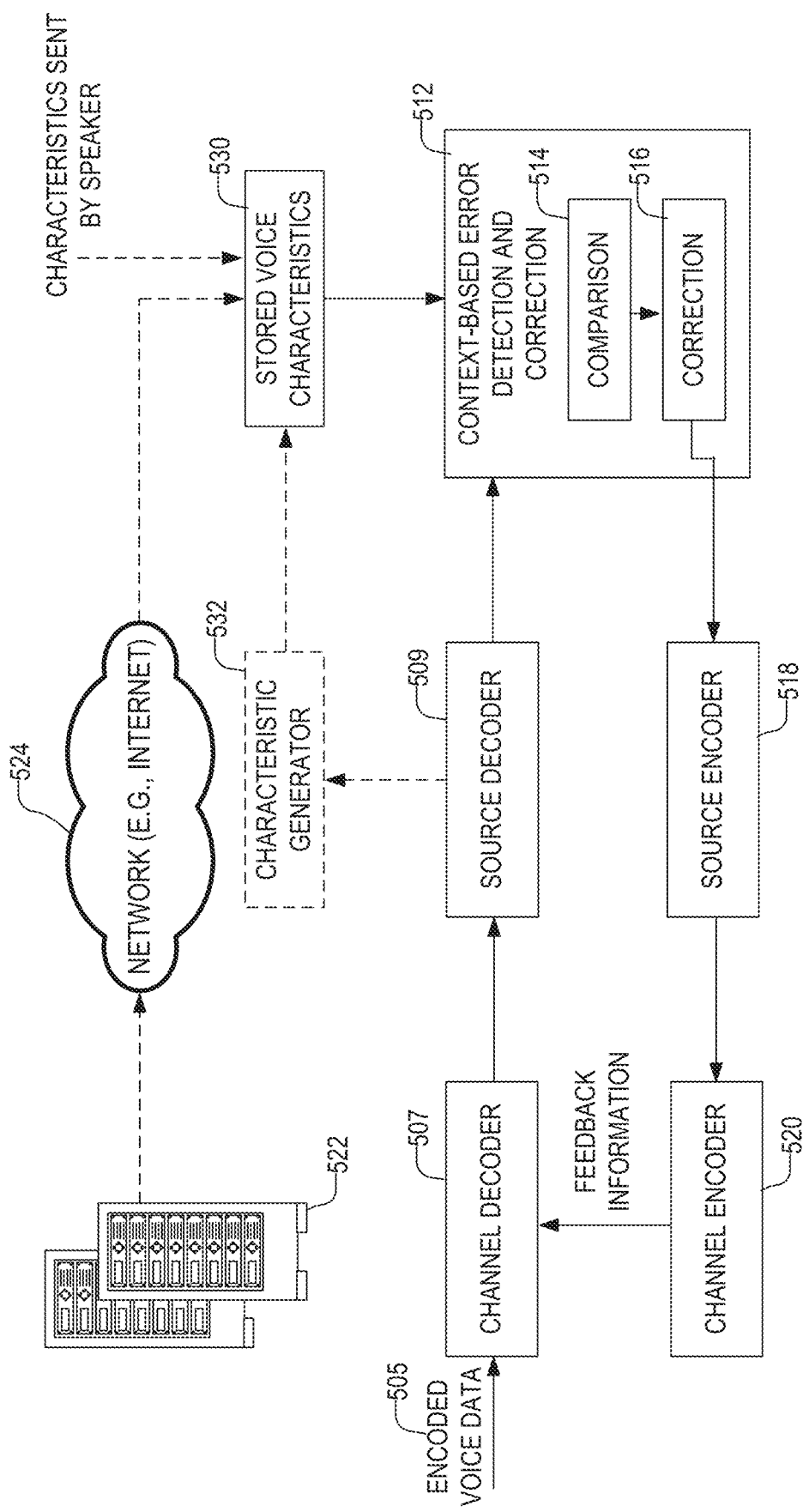
FIG. 5 illustrates the use of voice context information to determine decoding feedback information to improve the performance of a decoder according to some examples of the present disclosure.

FIG. 5 illustrates the use of voice context information to determine decoding feedback information to improve the performance of a decoder according to some examples of the present disclosure. Channel decoder 507 channel decodes encoded voice data 505. For example, using a Viterbi decoder and/or a turbo decoder. The source decoder 509 may then decode the output of the channel decoder 507. An application may output (e.g., to a speaker) the output of the source decoder 509. In addition, the context-based error detection and correction component 512—which may be part of the application—may utilize this output. Specifically, comparison component 514 of the context-based error detection and correction component 512 may compare the decoded speech data to one or more stored voice characteristics 530 of the speaker. If the comparison indicates that the decoded speech comports with the one or more stored voice characteristics 530 of the speaker, then the feedback information may be sent to the channel decoder 507 that the decoded speech was correct. If the comparison indicates that the decoded speech does not comport with one or more of the stored voice characteristics 530 of the speaker, then the speech data may be corrected by a correction component 516 to create corrected speech data. The corrected speech data may then be encoded, in some examples, by the source encoder 518, and also, or instead, be encoded by a channel encoder 520. This data may then be passed to the channel decoder 507 as a feedback information. Example channel codes may include a convolutional code, a cyclic redundancy check, turbo code, and the like. Example source codes may include media codecs such as scalable video coding (SVC), AAC, H265, MPEG encoding, H264, and the like.

In some examples, the one or more stored voice characteristics 530 may be sent by a network-based voice characteristic service 522 over a network, such as network 524 (which may be a same network, or portion of a same network, over which the encoded voice data 505 is received). In other examples, the one or more stored voice characteristics 530 may be sent by a computing device of the speaker (e.g., at the beginning of the communication session-such as prior to sending voice data). In still other examples, previous voice data from the present communication session may be used to calculate stored voice characteristics 530 using a characteristic generator component 532.

The network-based voice characteristic service 522 may collect voice samples from a variety of applications. For example, each time a user is part of a network-based communication session. So, for example, the decoded voice data shown in FIG. 5 may also be provided to the network-based voice characteristic service 522. The network-based voice characteristic service 522 may utilize the voice samples to create, update, and maintain the voice characteristics of a user. The service may do so with permission of the person whose voice is being profiled. For example, users may sign up to participate in the service, or may otherwise set preferences that enable the functionality.

Figure 6:
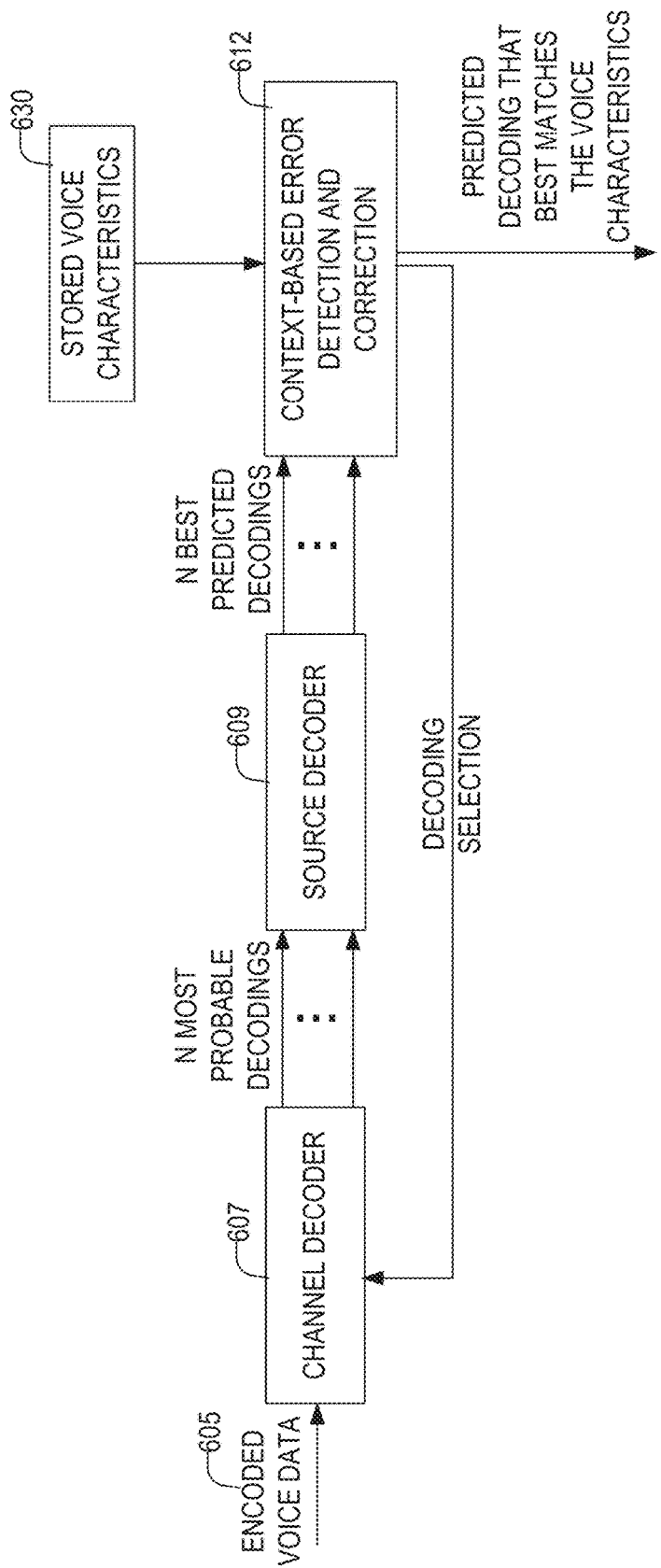
FIG. 6 illustrates the use of voice context information to determine decoding feedback information to improve the performance of a decoder according to some examples of the present disclosure.

FIG. 6 illustrates the use of voice context information to determine decoding feedback information to improve the performance of a decoder according to some examples of the present disclosure. In FIG. 6, the channel decoder 607 decodes encoded voice data 605. In this example, the channel decoder 607 outputs the N-most probable decoding possibilities. That is, the N decoding possibilities judged by the channel decoder 607 as most probable decoding possibilities. These may correspond to the N decoding possibilities with the lowest path costs in the trellis, the N decoding possibilities with a highest probability, or the like. N may be prespecified or may be determined based upon a threshold (e.g., all decoding possibilities above a certain probability threshold, or with a path cost lower than a threshold). Source decoder 609 may process each of the N-most probable decoding possibilities serially or in parallel. The source decoded N-most probable decoding possibilities may then be tested by the context-based error detection and correction component 612. Context-based error detection and correction component 612 may compare each source decoded N-most probable decoding possibilities against one or more of the stored voice characteristics 630 and select the one that most closely matches (e.g., one with a minimum error) one or more of the stored voice characteristics. The selected source decoded N-most probable decoding may be output to the user and the choice of which decoding was selected (either a number indicating which one was selected, or the decoding itself) may be passed to the channel decoder 607 as decoding feedback.

Figure 7:
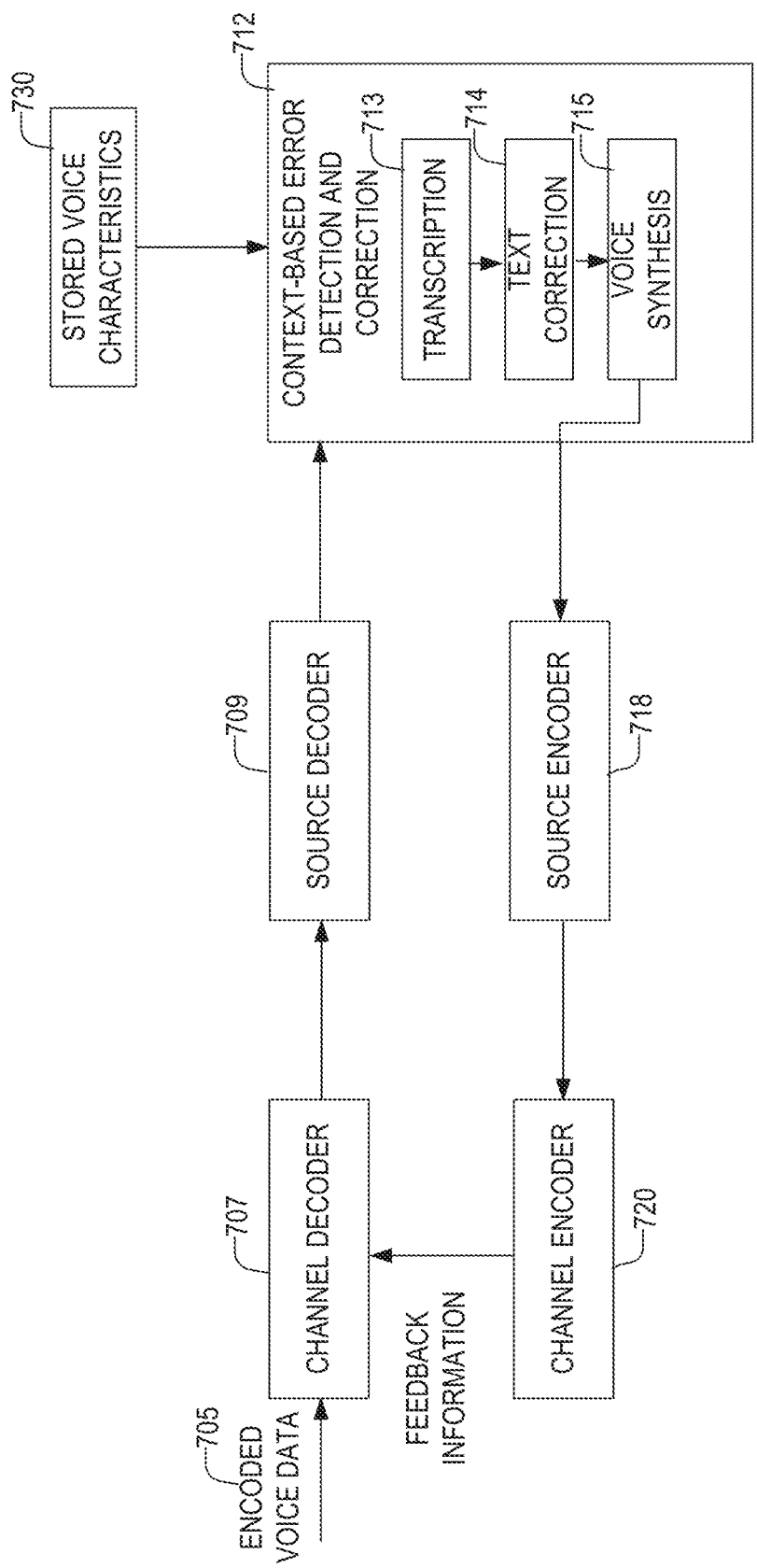
FIG. 7 illustrates the use of voice context information to determine decoding feedback information to improve the performance of a decoder according to some examples of the present disclosure.

FIG. 7 illustrates the use of voice context information to determine decoding feedback information to improve the performance of a decoder according to some examples of the present disclosure. The channel decoder 707 decodes encoded voice data 705. The source decoder 709 then decodes the output of the channel decoder 707. The decoded voice data is then sent to the application for output to a user and may be sent to the context-based error detection and correction 712. In some examples, transcription component 713 of the context-based error detection and correction 712 may transcribe the voice data. The text correction component 714 utilizes the transcription and the techniques previously described (which may include predicting a next word or sentence) to correct a previously uttered phrase or predict a next-uttered phrase. This data is then used by the voice synthesis component 715 to create synthesized speech in the voice of the speaker. This source encoder 718 and the channel encoder 720 may then source and channel encode the synthesized speech, respectively. This encoded synthesized speech may then be passed as feedback information to the channel decoder 707 for decoding future received encoded voice data 705. The transcription component 713 and/or the voice synthesis component 715 may utilize one or more stored voice characteristics 730 of the speaker in order to transcribe and/or synthesis the voice data.

Figure 8:
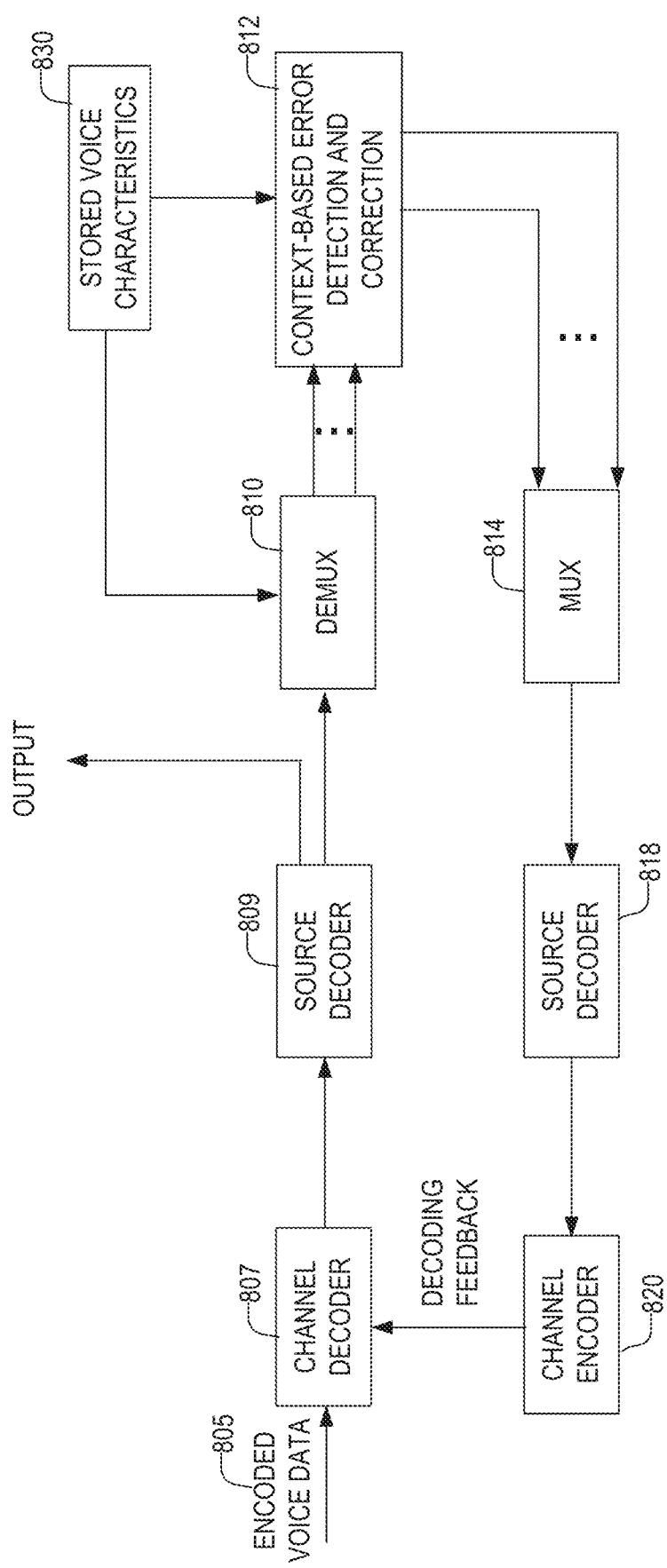
FIG. 8 illustrates the use of voice context information to determine decoding feedback information to improve the performance of a decoder in environments with multiple speakers according to some examples of the present disclosure.

FIG. 8 illustrates the use of voice context information to determine decoding feedback information to improve the performance of a decoder in environments with multiple speakers according to some examples of the present disclosure. The channel decoder 807 decodes encoded voice data 805. The source decoder 809 then decodes the output of the channel decoder 807. The decoded voice data is then sent to the application for output to a user. Demultiplexer component 810 then separates each voice stream into a plurality of individual voice tracks. Context-based error detection and correction component 812 may then correct each voice track individually as previously described, and send each individually corrected voice track to the multiplexor 814. Multiplexor 814 may re-multiplex the streams. This source encoder 818 and the channel encoder 820 may then source and channel encode the re-multiplexed audio data which may then be passed as feedback information to the channel decoder 807 for decoding future received encoded voice data 805. One or more stored voice characteristics 830 may be used to demultiplex the streams and/or to produce the corrections of the context-based error detection and correction component 812.

Figure 9:
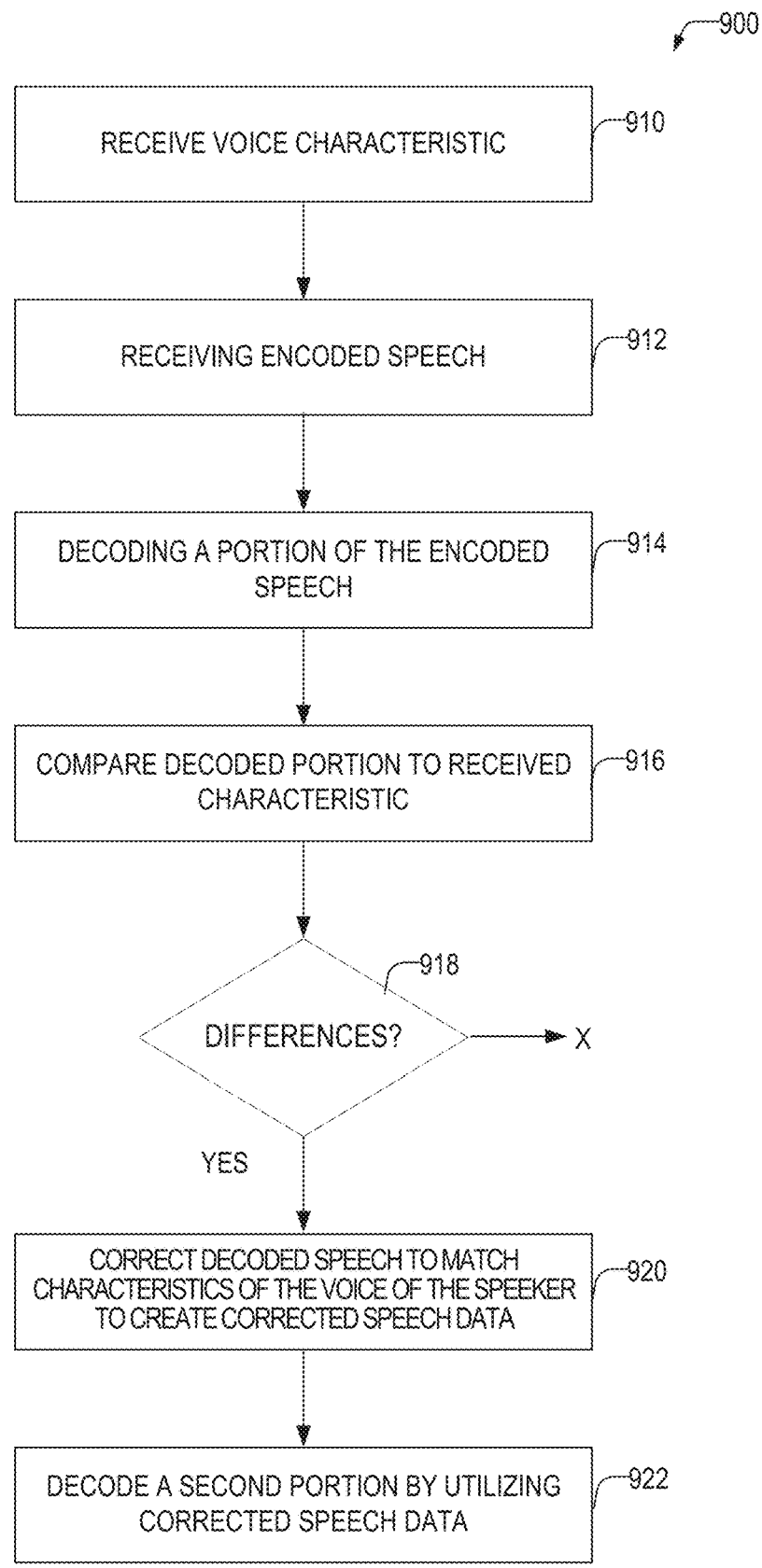
FIG. 9 illustrates a flowchart of a method of improving decoder performance using voice context information according to some examples of the present disclosure.

FIG. 9 illustrates a flowchart of a method 900 of improving decoder performance using voice context information according to some examples of the present disclosure. At operation 910, the system receives, over a network, one or more characteristics of the voice of the speaker of a communication session. For example, the one or more characteristics may be sent by the speaker (e.g., prior to the communication session), the one or more characteristics may be determined using previously received speech from the speaker or may be obtained from a network-based service. The network-based service may receive speech data samples for users from a variety of communication applications and may utilize that data to create and maintain the one or more characteristics. Example characteristics may include the MFCC data. The voice characteristics may be received as part of a communication session.

At operation 912, the system receives encoded speech data of the speaker, such as during the communication session. The encoded speech data may be received from a speaker's computing device, from a server device, or the like. In other examples, the encoded speech data may be received from a storage device.

At operation 914, the system may decode, using a decoder, a first portion of the encoded speech data of the speaker to produce decoded speech data. Example decoders may include channel decoders, source decoders, or the like.

At operation 916, the system may compare the decoded speech data with the one or more received characteristics of the voice of the speaker. For example, by utilizing speaker identification algorithms such as a support vector machine (SVM), neural networks such as a convolutional neural network (CNN), or the like and using the characteristics (e.g., such as MFCC data). In some examples, if the audio data is determined to come from the speaker identified by the characteristics, then the decoded speech data is considered to have matched the voice characteristics. If the audio data is determined by the algorithm as uncertain or not to come from the speaker identified by the characteristics, then the decoded speech data is considered to not match the voice characteristics. Where the voice characteristics are simple, such as pitch or frequency, the audio data matches the voice characteristics when the pitch and/or frequency of the decoded audio matches the pitch and/or frequency of the voice characteristics.

At operation 918, the system may determine that the decoded speech data does not match the received characteristic of the speaker based upon a result of the comparing the decoded speech data with the received characteristic of the voice of the speaker. If there are no differences, then the method may end. If there are differences, then responsive to determining that the decoded speech data does not match the received characteristic of the speaker, the method may perform operations 920 and 922.

At operation 920, the system may correct the decoded speech data to match the characteristic of the voice of the speaker to create corrected speech data. The system may utilize one or more machine-learning algorithms such as generative adversarial networks (GAN), neural networks such as a CNN, and the like.

At operation 922, the system may decode, by the decoder, a second portion of the encoded speech data to create a second decoded speech data by utilizing the corrected speech data to eliminate at least one wrong decoding of the second portion of the encoded speech data. In some examples, the corrected speech data may first be source and/or channel encoded for use by the decoder. The decoder may utilize the corrected speech data by removing or pruning paths of a decoding trellis, updating or modifying state and/or path values, biasing probabilities of one or more possible decodings, and the like.

Object Recognition

If the data being decoded is image or video data, the receiver may employ object recognition algorithms to create decoding feedback. For example, by determining that an object that is expected in the image is not detected, that a detected object does not have expected characteristics, or that object detection is not possible given a decoded image quality, the system may provide various forms of feedback to the decoder.

In some examples, the objects recognition may be blind, where recognition is based on absolute figures where there is no reference to compare the images. In these examples, an image portfolio may be developed in real time as the voice stream or video stream progresses. Initially, there would be a detection of general figures, then in future frames, these figures are constructed into familiar clusters; in still future frames the image background (for example) may form a familiar background that may be used to allow detection of the background to improve the performance of future source coding/channel coding frames. In other examples, the object recognition may be based upon comparing figures to geometric configurations stored on a network-based service. The object recognition may look for particular prespecified objects in a library of user surroundings that is stored locally at the computing device or on a network-based service or an edge device. In some other examples, the object recognition may be learned, where recognition is based on real time learning from a current sequence of images. For example, objects and their characteristics detected in previous frames may be searched for in later frames. This may have good applicability to video with static backgrounds. In still other examples, the sender and/or a network-based intermediary may perform the object recognition and send to the receiver the detected objects and their characteristics. In still other examples, the object may be a human face that is recognized using facial recognition and identification techniques.

The video or frame may be corrected based upon the object recognition such that the recognized object matches the characteristics of the expected objects. For example, by using machine-learning techniques like deep-learning super sampling to correct the image. The corrected image may then be encoded and used by the decoder as described to improve the decoding performance of future frames.

In still other examples, frame generation techniques of the deep-learning super sampling may be used as feedback information to determine one or more decodings of one or more future frames based upon current frames. For example, using predictive information to predict the next frame. This predicted frame may then be encoded and used as described herein by the encoder to improve the performance of the decoding.

In still other examples, the decoder may output a plurality of decoding possibilities and the object recognition may be used to select the best possible encoding from the plurality of outputted decoding possibilities. In yet other examples, the system may utilize facial recognition algorithms to provide decoding information.

Figure 10:
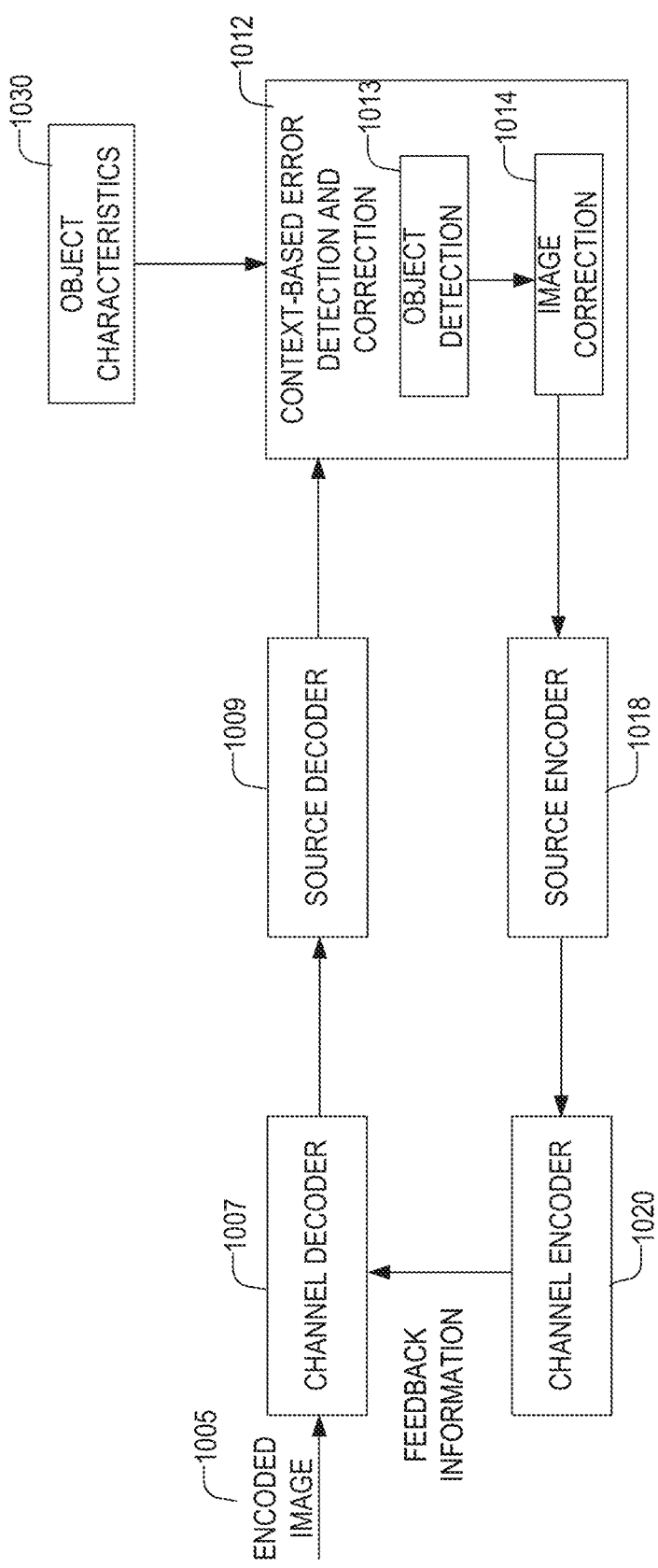
FIG. 10 illustrates the use of object recognition information to determine decoding feedback information to improve the performance of a decoder according to some examples of the present disclosure.

FIG. 10 illustrates the use of object recognition information to determine decoding feedback information to improve the performance of a decoder according to some examples of the present disclosure. Channel decoder 1007 and source decoder 1009 may channel and source decode encoded image data 1005 respectively. The encoded image data 1005 may then be output to the user. In some examples, the object detection component 1013 of the context-based error detection and correction component 1012 may analyze the unencoded image data. The object detection component 1013 may search for objects in the image.

The objects that are searched for may be unknown—that is, the object detection searches for any and all objects. In some examples, the library of objects that is searched for is not defined, but in other examples, the library may be a predetermined library of objects given by the object characteristics 1030. If no objects are found, then the feedback information to the decoder is that the decoding is not correct. In this example, the decoder may utilize this feedback to prune the trellis of the chosen decoding, increase a path cost of the chosen decoding, and the like.

In other examples, the object detection component 1013 searches for objects that are specified by the sender communication device—e.g., the sender device searches for objects in the image and then sends the identity and in some examples, characteristics of the objects to the receiver as object characteristics 1030. The list of objects and/or their characteristics may be sent over a same communications channel as the image, or to improve redundancy, over an alternative communication channel. In yet other examples, an intermediate server—e.g., a communication server searches for objects in the image and then sends the identity and in some examples, characteristics of the objects to the receiver. In other examples, the expected objects and their characteristics may be created from previous images-such as previous video frames.

In some examples, instead of simply providing feedback to the decoder of whether certain objects were recognized or not, the image correction component 1014 may attempt to correct the image. For example, by utilizing a convolutional neural network (CNN) algorithm, a deep learning super sampling (DLSS) algorithm, or the like using the object detection results from the object detection component 1013. In yet other examples, the image correction component 1014 may iteratively apply one or more denoising, anti-aliasing, or other image correction algorithms until the object detection component 1013 detects the expected objects in the image. The source encoder 1018 and the channel encoder 1020 may then source and channel encode the data respectively and then pass the decoding feedback information to the channel decoder 1007 for processing of future data.

In some examples, for video, a frame generation algorithm may provide decoder feedback information on a prediction of what the next frame in a sequence is likely to be. That is, the context-based error detection and correction component 1012 may feed a first sequence of one or more frames to a frame generation algorithm (such as a DLSS 3.0 algorithm) to generate one or more predicted subsequent frames. The channel decoder 1007 may then utilize the predicted frames to adjust one or more path costs, prune the trellis, or update one or more decoding probabilities to bias decoding possibilities that are close, or match, the predicted frames for future data.

Figure 11:
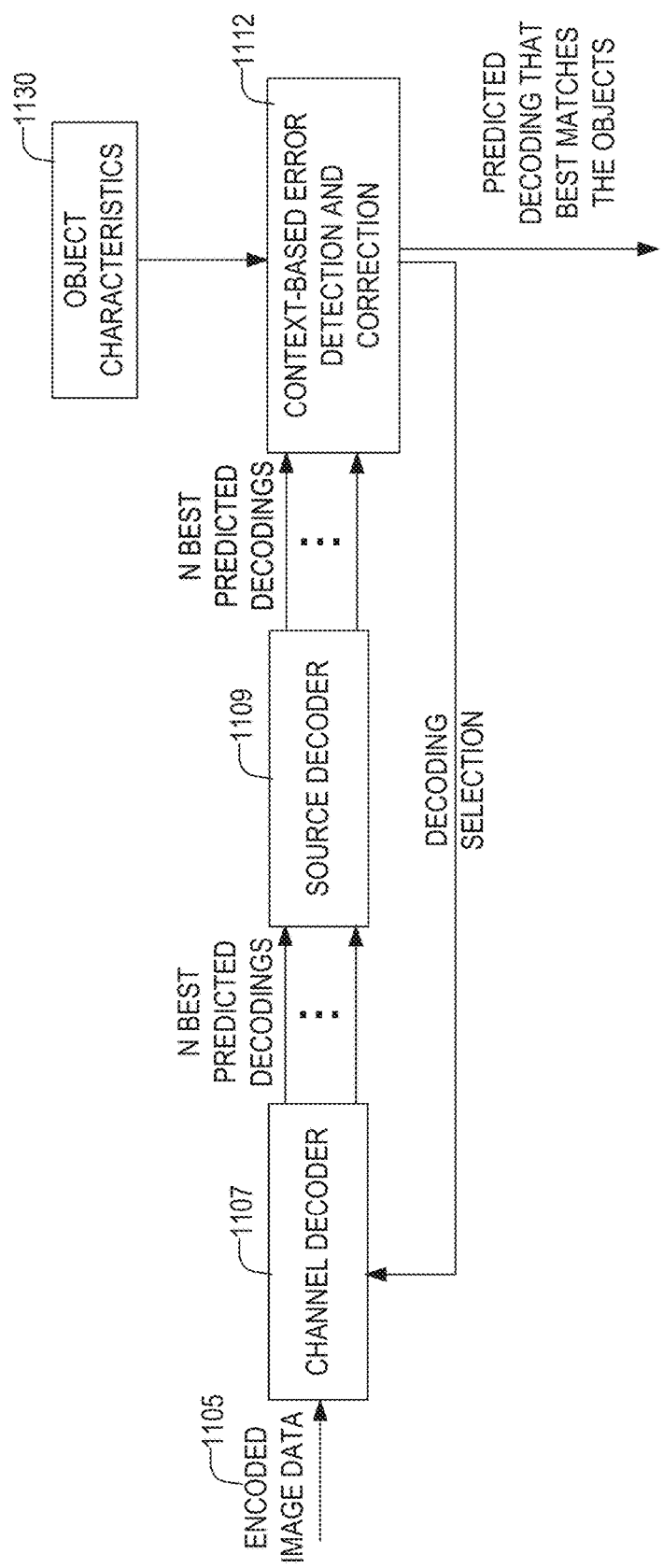
FIG. 11 illustrates the use of object recognition information to determine decoding feedback information to improve the performance of a decoder according to some examples of the present disclosure.

FIG. 11 illustrates the use of object recognition information to determine decoding feedback information to improve the performance of a decoder according to some examples of the present disclosure. In FIG. 11, the channel decoder 1107 decodes encoded image data 1105. In this example, the channel decoder 1107 outputs the N-most probable decoding possibilities. That is, the N decoding possibilities judged by the channel decoder 1107 as most probable decoding possibilities. These may correspond to the N decoding possibilities with the lowest path costs in the trellis, the N decoding possibilities with a highest probability, or the like. N may be prespecified or may be determined based upon a threshold (e.g., all decoding possibilities above a certain probability threshold, or with a path cost lower than a threshold). Source decoder 1109 may process each of the N-most probable decoding possibilities serially or in parallel. The source decoded N-most probable decoding possibilities may then be tested by the context-based error detection and correction component 1112. Context-based error detection and correction component 1112 may utilize the aforementioned object recognition process and select the decoding where one or more of the detected objects most closely matches (e.g., one with a minimum error) the expected objects and/or their object characteristics 1130. The selected source decoded N-most probable decoding may be output to the user and the choice of which decoding was selected (either a number indicating which one was selected, or the decoding itself) may be passed to the channel decoder 1107 as decoding feedback.

Figure 12:
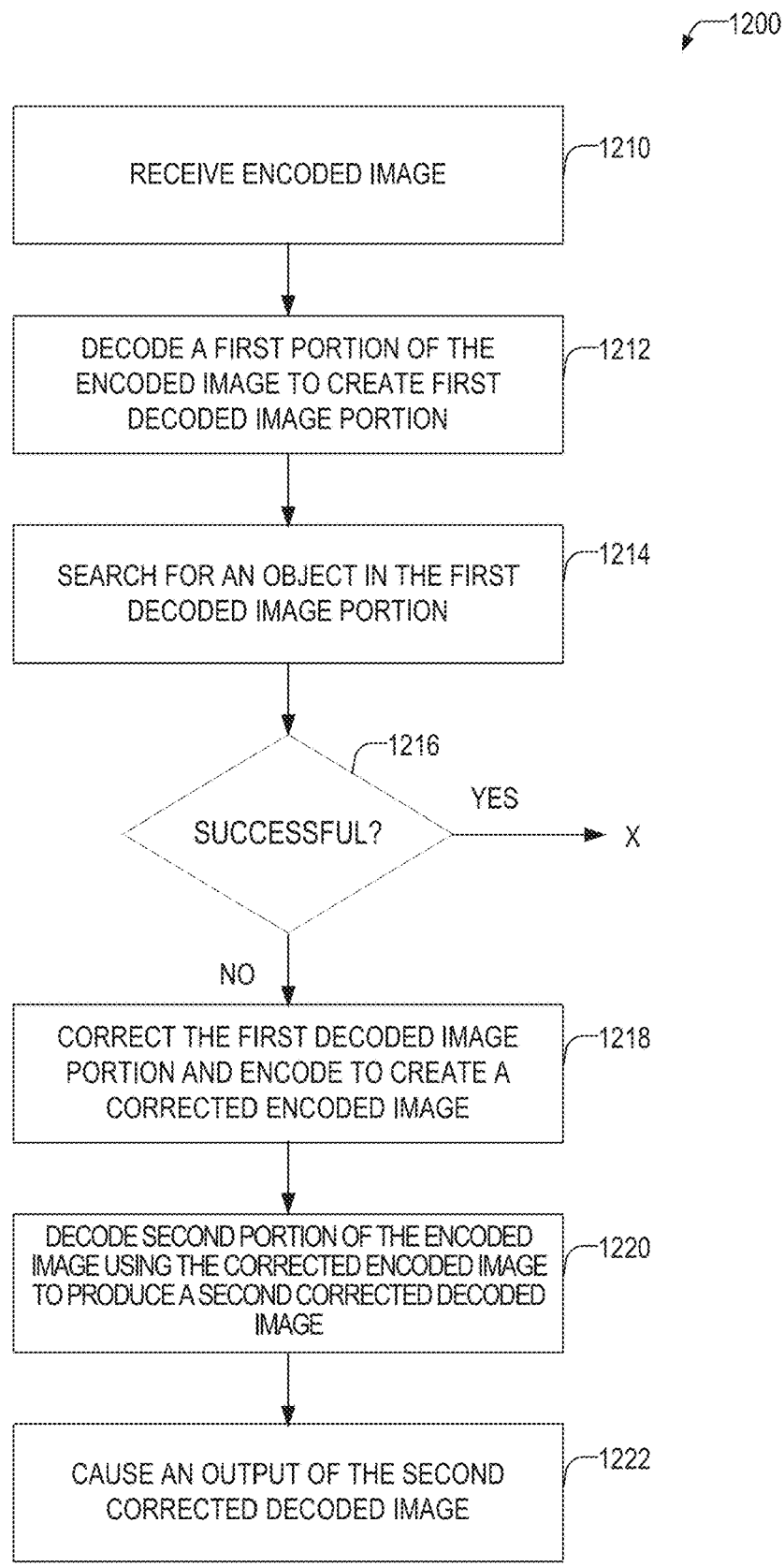
FIG. 12 illustrates a flowchart of a method 1200 of improving decoder performance using object recognition according to some examples of the present disclosure.

FIG. 12 illustrates a flowchart of a method 1200 of improving decoder performance using object recognition according to some examples of the present disclosure. At operation 1210 the system receives encoded image data from a sender, such as video associated with a communication session. The encoded image data may be received from a speaker's computing device, from a server device, an edge device or the like. In other examples, the encoded image data may be received from a storage device.

At operation 1212 the system may decode a first portion of the first encoded image to create a first decoded image portion. Example decoders may include channel decoders, source decoders, both channel and source decoders, and the like.

At operation 1214 the system may search for an object in the first decoded image portion. For example, by searching for one or more geometric shapes, searching for objects detected in previous frames of a video stream corresponding to the sender, or the like. In some examples, the objects that are searched for may be provided by a communication server or the sender. The object recognition and searching algorithms may include non-neural network-based approaches combined with a classifier such as a support vector machine (SVM). Example non-neural network-based methods include the Viola-Jones object detection framework, Scale-Invariant Feature Transform (SIFT), Histogram of oriented gradients (HOG) features, or the like. Neural network approaches include Region-based Convolutional Neural Networks (R-CNN), Single Shot Multibox detector (SSD), You Only Look Once (YOLO), Single-Shot Refinement Neural Network for Object Detection, and the like.

At operation 1216, the system determines whether the object searching at operation 1214 was successful. If, the object search was successful, then operation terminates (e.g., until the next frame or image), otherwise operation proceeds to operations 1218-1222. Whether or not the object search was successful or not may in some examples be that a threshold number or percentage of objects expected to be in the frame were identified in the frame and in some examples, where of the characteristics that were expected. In other examples, success may be whether any object was recognized. In yet other examples, the object may be a face of the sender and the object searching may be successful if the face of the sender is recognized and identified as the sender.

At operation 1218, if the object searching failed or the object was not as expected, the system may correct the first decoded image portion. For example, using image correction algorithms based upon the expected object characteristics, such as by using DLSS, XeSS, FSR, or the like. In some examples, the corrected image is source and/or channel decoded.

At operation 1220, the system may decode a second portion of the encoded image (e.g., a second portion of video, or the like) or a second encoded image, using the corrected encoded image to produce a second corrected decoded image. For example, by utilizing the corrected encoded image as decoding feedback. At operation 1222 the system may output the second corrected decoded image—e.g., on a display device of the recipient.

Multi-Rate Decoding

Image, video, and audio-based source coding techniques are based on multi-rate transmission techniques. In this case, CODEC rate is negotiated end to end. Once a data rate R is decided, transmission between the network elements (cloud-user or cloud-edge-user) is fixed for a sequence of packets. In some examples, after the fixed sequence, the coding rate may be adjusted. In some examples, these source codes may be improved by a multi-rate coding technique where a basic video or image is transmitted at a low rate, then details get added sequentially based on one or more of: user input (e.g., user selects an enhanced image option), physical and link layer characteristics (which may include historical or real time bandwidth available and channel noise characteristics), and/or congestion in network nodes.

In some examples, the base layer stream may be sent automatically, and one or more enhancement layers or streams may be sent depending on the above-mentioned factors. In some examples, the enhancement layers or streams may be cached at one or more edge computing devices including end-user devices e.g., based upon a cost function (e.g., cost associated with the three points above).

In some examples, a source encoder decomposes the signal using wavelet transform into a basic signal R and details $\{\lambda 1, \lambda 2, \ldots, \lambda s\}$. A continuous version of the wavelet transforms with index s and spectrum spread $\tau$ is given by:

$$F(\tau, s) = \frac{1}{\sqrt{|s|}} \int_{-\infty}^{\infty} f(t)\psi^*\left(\frac{t-\tau}{s}\right)dt$$

A familiar discrete version of $F(\tau,s)$ is used. The number s is determined by the multi-rate depth that is provisioned by the system administrator (e.g., an IT admin). In this case the full data rate R=R0 U $\lambda 1$ U $\lambda 2$ . . . U $\lambda s$, R1=R0 U $\lambda 1$, . . . . . Rn=R(n−1) U $\lambda n$. As can be appreciated, just as details are added, details can be removed depending on user feedback, capabilities of the device, or network conditions.

In some examples, the object recognition methods described above may be utilized in a system such as multi-rate decoding. For example, when the object recognition algorithms fail to detect one or more objects (e.g., the number of recognized objects is less than a specified threshold T) the system may request additional layers from the sender, a server, or edge devices. These additional layers may then be used by the decoder as decoding feedback to reduce the decision region for a higher probability decision and a better decoding. Thus, by adding detail, the decoder and/or object recognition process described above may function more efficiently.

Figure 13:
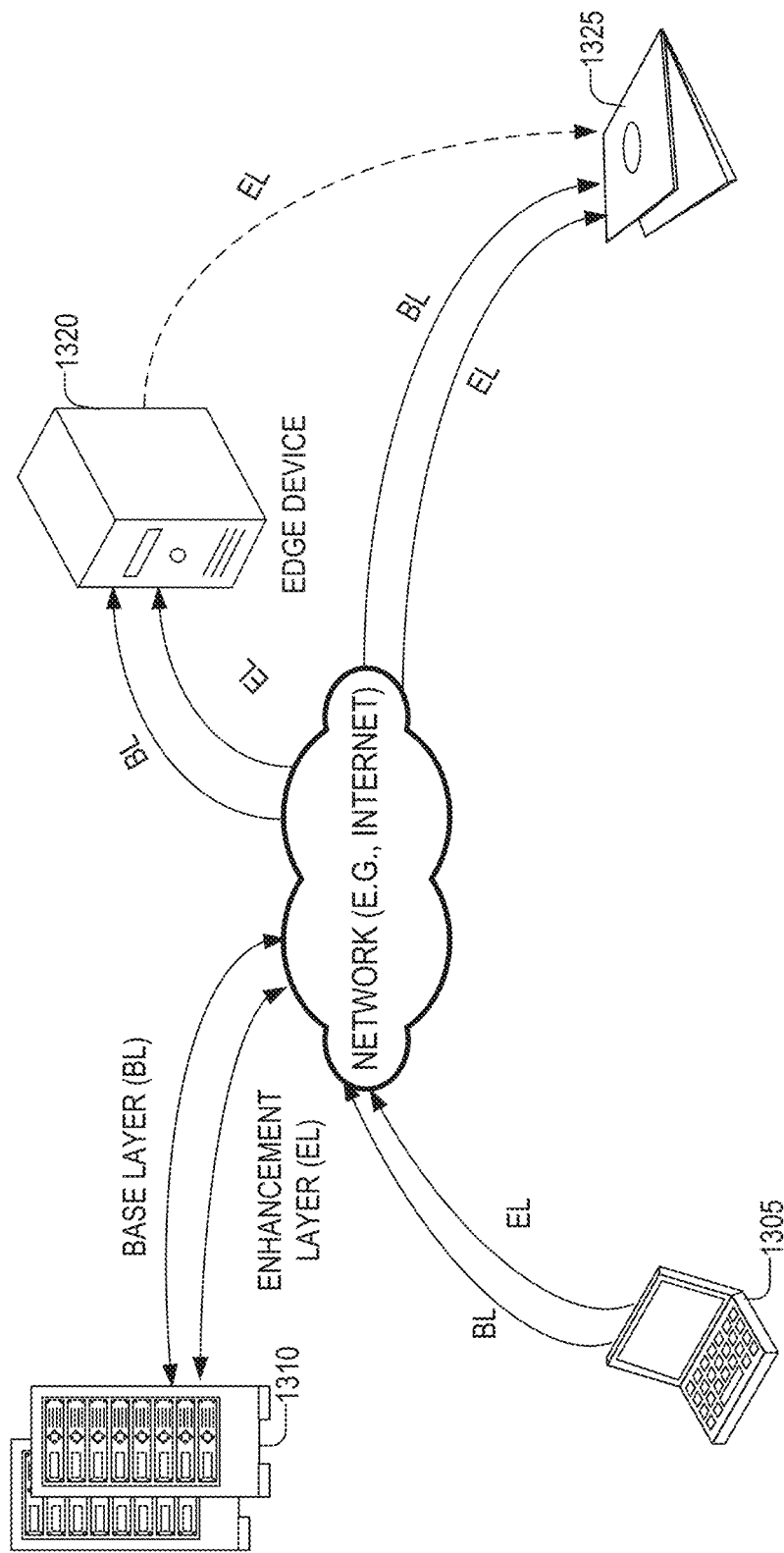
FIG. 13 illustrates a diagram of a multi-rate decoding scenario with edge caching according to some examples of the present disclosure.

FIG. 13 illustrates a diagram of a multi-rate decoding scenario with edge caching according to some examples of the present disclosure. A transmitting device 1305 transmits images, such as video streams to a receiving device 1325. In some examples, the transmitting device 1305 sends the images through a communications server 1310. In some examples, the transmitting device 1305 encodes the image using multiple layers, such as described above. For example, a base layer (BL) and an enhancement layer (EL). The enhancement layer adds additional detail such as increasing a size of the BL, a resolution of the BL, a bitrate of the BL, a frame rate of the BL, or the like. Communications server 1310 may process the images-such as by compositing multiple images from multiple transmitting devices-such as during a communication session (e.g., an online meeting). In other examples, the actual encoding done on the transmitting device 1305 may be a simpler encoding with a single layer and the communication server 1310 may re-encode the image or composited image with the multi-rate encoding.

The communications server 1310 may transmit the BL stream to the receiving device 1325. In addition, the communications server 1310 may transmit one or more EL streams based on one or more of: user input (e.g., user selects an enhanced image option), physical and link layer characteristics (which may include historical or real time bandwidth available and channel noise characteristics), and/or congestion in network nodes. In some examples, the communications server 1310 determines whether to transmit the EL streams, but in other examples, the receiving device 1325 may request the EL streams based upon the above-mentioned factors.

In some examples, one or more of the BL and/or EL streams may be cached at one or more edge devices, such as edge device 1320. The receiving device 1325 may obtain one or more of the BL and/or EL streams from an edge device 1320. This may allow the receiving device 1325 to receive the BL and/or EL streams faster or avoid network problems that may hinder receiving the EL or BL streams from either the communications server 1310 or transmitting device 1305.

File Storage and Future Edits

As previously described, the methods, systems, and machine-readable mediums described herein may also be applied to reading data from storage devices. For example, some storage devices may not be completely reliable. That is, media stored at rest may be modified unintentionally through a number of physical processes. For example, solar flares may induce bit flips, read-disturb errors from solid state storage; and magnetic interference on hard disk drives (HDD) all may cause data read errors. In some examples, to more securely store this data, the data may be encoded prior to storage. In addition, rather than immediately decode a transmission, sometimes the receiving computing device may simply stream the received data to a storage device. Thus, the data may be stored in an encoded state and the source of the data that is being decoded may be a storage device.

In addition, in some examples, the decoding feedback may comprise one or more edits made to a document. For example, if the document is the content, then a user may edit one or more portions of the document. This editing may be provided to a decoder as decoding feedback information for other portions of the document, feedback to re-decode the current document, or feedback for another document.

Figure 14:
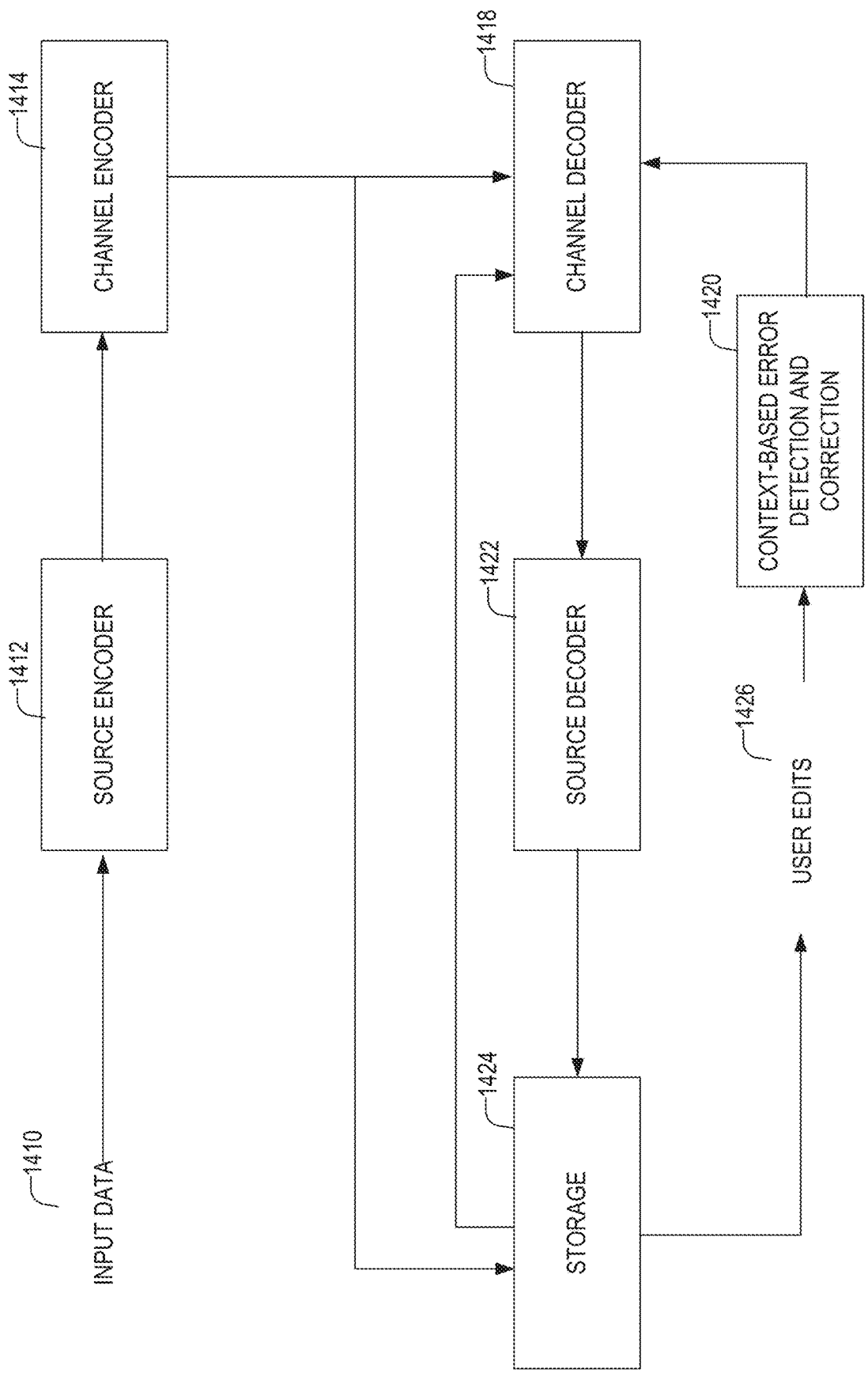
FIG. 14 illustrates the use of future user edits to stored data to determine decoding feedback information to improve the performance of a decoder according to some examples of the present disclosure.

FIG. 14 illustrates the use of future user edits to stored data to determine decoding feedback information to improve the performance of a decoder according to some examples of the present disclosure. Source encoder 1412 and channel encoder 1414 may source encode and channel encode the input data 1410 respectively. This data may then be stored in a storage device 1424 or may be transmitted across a communication medium. Channel decoder 1418 then decodes this data, either from storage, or as received from the communication medium. The source decoder 1422 then decodes the channel decoded data. This data may then be stored in storage device 1424 or may be output to a user. Context-based error detection and correction component 1420 may utilize one or more user edits 1426 to create decoder feedback information. For example, by source encoding and channel encoding the corrected file.

Predictive Feedback Information

As previously described, various feedback information may be used by the decoder to correct a previously incorrect decoding and thus correct a memory of the decoder to enable correct decoding of future data. In some examples, rather than using corrected data to fix a decoder state, the predictive information may be used to prevent an incorrect decoding in the first place. That is, the decoder may utilize the predictive feedback information to predict one or more decoding possibilities. The decoding possibilities corresponding to the predicted data may be made more likely to be chosen as the decoding by the decoder. For example, by decreasing a path cost corresponding to the decoding that corresponds to the predicted data, increasing other path costs that do not correspond to the decoding that corresponds to the predicted data and/or both. In other examples, this may be achieved by increasing or decreasing probabilities in a turbo decoder such that decoding possibilities corresponding to the predicted data may be more likely to be chosen.

In other examples, a plurality of possible decoding possibilities may be output. For example, rather than choosing a single decoding, the decoder may choose a specified number K of the most likely decoding possibilities. For a trellis decoder, the most likely decoding possibilities may correspond to the decoding possibilities with a lowest total path cost. For a turbo decoder, the most likely decoding possibilities may correspond to the decoding possibilities with the highest probabilities. The predictive information may then assist the decoder to choose one of the K possible decoding possibilities. This may be done by biasing the path scores or probabilities of each decoding based upon the predictive information. For example, by biasing the path score based upon the word usage frequency of the sending user. Thus, decoding possibilities corresponding to words used often by the sender may have their path costs lowered and decoding possibilities corresponding to words used less often by the sender may have their path costs lowered less, kept the same, or even raised. That is, the bias applied to the path score may be based upon the word frequency usage of the sender. In other examples, the system may predict a next word or phrase and decoding possibilities that correspond to the next word or phrase may be biased in that the path cost of those words and/or phrases may be lowered or the probabilities of those words and/or phrases may be increased-depending on the type of decoder.

The same predictive techniques may be used for voice data where frequency of word choice or predicted next utterances may be similarly used. Thus, the system may predict a next utterance of a user based upon the user's past utterances. For example, by transcribing the user's speech and then applying the same text prediction algorithms. Additionally, word history frequency databases may be used to determine which of a plurality of decoding possibilities are likely. For example, speech samples-either captured live or generated synthetically as previously described may be used as feedback information along with frequency information.

In the case of video data, the system may predict a next frame of a video based upon other video frames. For example, using deep learning super sampling, X E super sampling, fidelity super resolution, or the like. In some examples, decoded frames within a prespecified threshold variance from the predicted frames may be positively biased (e.g., the decoding is more likely to be selected) and other frames may not be biased or may be negatively biased. The variance may be measured based upon a number of different pixel values.

Figure 15:
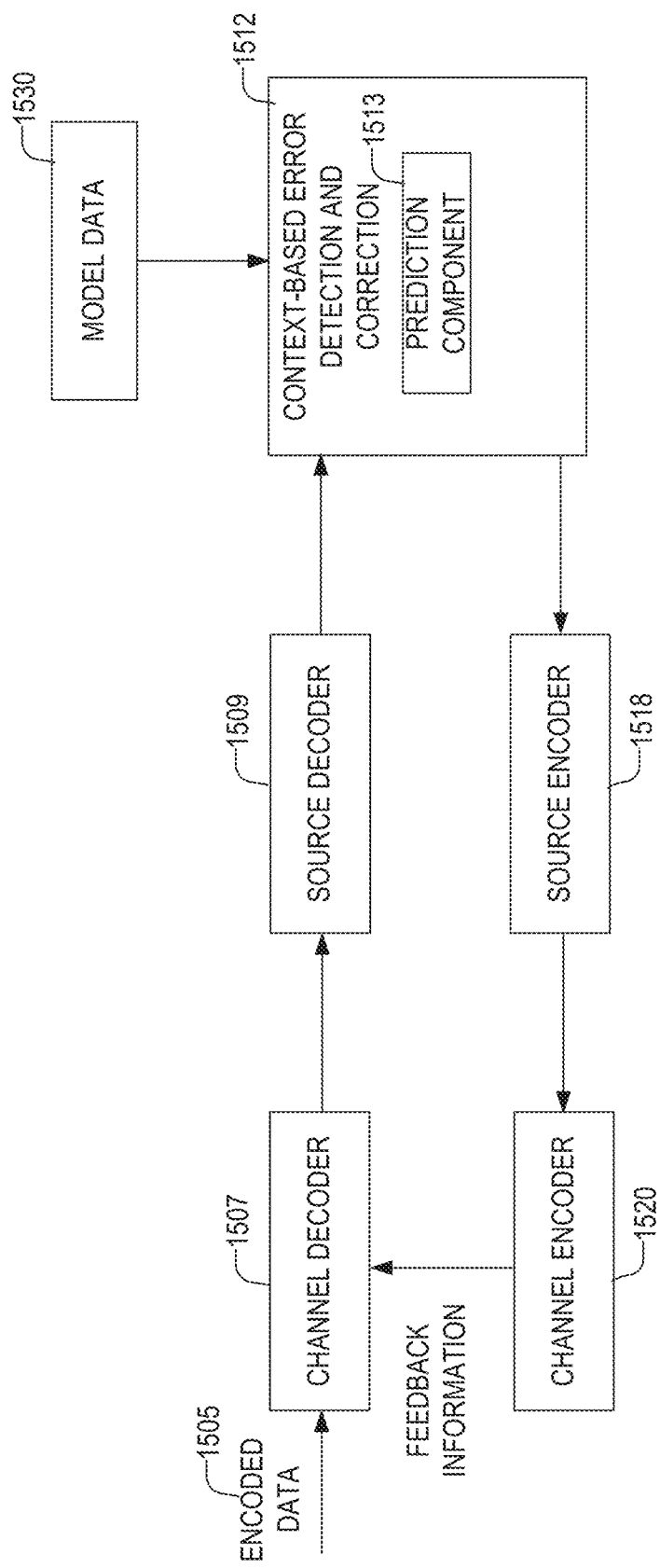
FIG. 15 illustrates the usage of predictive information as feedback information to a channel decoder according to some examples of the present disclosure.

FIG. 15 illustrates the usage of predictive information as feedback information to a channel decoder according to some examples of the present disclosure. The channel decoder 1507 channel decodes the encoded data 1505. Encoded data 1505 may include text data (such as a chat, or other conversation), voice data, image data, video data, file data, or the like. The source decoder 1509 then decodes the channel decoded data and outputs the result. The source decoder 1509 may utilize feedback information such as feedback information based upon word-frequency distributions. The prediction component 1513 of the context-based error detection and correction component 1512 may utilize the decoded data to provide predictions of next data likely to be received from the transmitting device. For example, a next word, phrase, or other text item; utterance; or the like. In some examples the prediction may be a next frame of a video stream. In some examples, the prediction component 1513 may utilize the model data 1530 to predict the next data. The source encoder 1518 and channel encoder 1520 may source and channel encode the prediction data respectively.

Figure 19:
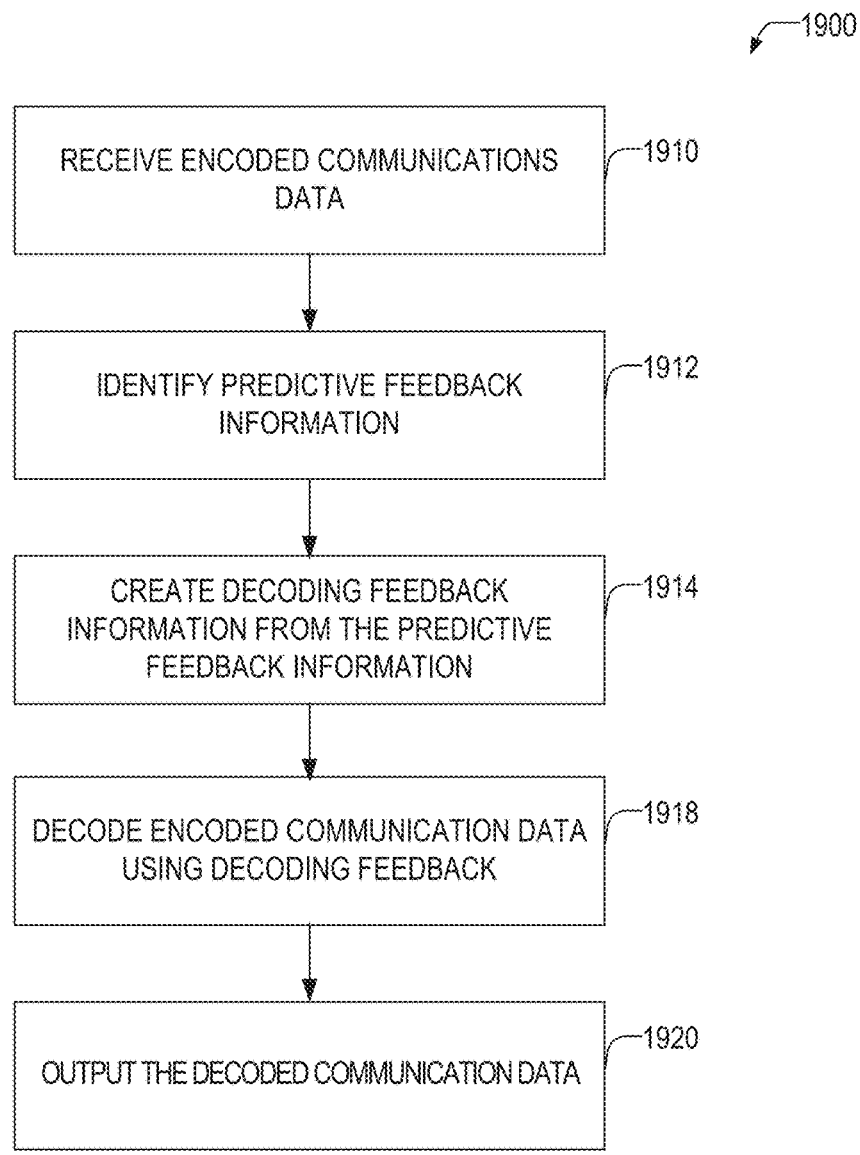
FIG. 19 illustrates a flowchart of a method of utilizing predictive feedback information according to some examples of the present disclosure.

FIG. 19 illustrates a flowchart of a method 1900 of utilizing predictive feedback information according to some examples of the present disclosure. At operation 1910 the system receives encoded communication data encoded with an error correction code, the encoded communication data being communications from a communicating user. The communications data may be voice, images (such as video), text, or the like. The data may be received over a computing network or other transmission medium, or may be read from storage.

At operation 1912, the system may identify predictive feedback information of the communicating user based upon previous communications of the communicating user. For example, using a word frequency distribution from previous communication sessions, the current communication session or the like. In other examples, other types of predictive feedback may include a next video frame predicted by, e.g., a DLSS 3.0 frame generation technique; predicted next text from a sentence completion algorithm; or the like. The system may identify this information by calculating it, receiving it (e.g., from a communicating user or a third party); or the like.

At operation 1914, the system may create using the predictive feedback information, decoding feedback information, the decoding feedback information comprising encoded data that is predictive of communications sent by the communicating user. The decoding feedback information may be a source and/or channel encoded version of the predictive information—for example, source and/or channel coded predicted next text; predicted next frame; or the like.

At operation 1916, the system may decode, by a decoder and using the decoding feedback information, the encoded communication data to produce decoded communication data, the decoding using the decoding feedback information to select one or more of a plurality of probable decodings. For example, by changing a path cost, a probability, or the like.

At operation 1918, the system may cause an output of the decoded communication data. For example, by displaying it or playing it through speakers.

Usage of the Decoding Feedback Information

As previously described, the feedback information may be used by a decoder to increase the speed and/or accuracy of the decoder. This may be done in a variety of ways. One example is to increase path costs for certain decoding possibilities; decrease path costs for other decoding possibilities; or both. For example, the feedback information may be coded word frequency distribution information that describes a distribution of language usage of a transmitting user. For example, a channel coded message of 1011 1001 0011 may be received. This message may have a first decoding that translates to the word "fax" and a second word that translates to the word "fix." The decoder may have an understanding that the first word ("fax") occurs in the sender's communication patterns (e.g., spoken, written, or both) much less than the word "fix" and thus the decoding that represents fix is more likely to be a correct decoding. In some examples, the decoder may decrease the path cost for the decoding representing the word "fix." In some examples, in addition, or instead of decreasing the path cost for the decoding representing the word "fix," the decoder may increase the path cost of the decoding representing the word "fax." The coder may know which decoding possibility represents the word "fax" and "fix" because each word may be channel and source encoded and may include the corresponding usage frequency.

In another example, probabilities may be biased. For example, in the above-mentioned word frequency distribution example, if the decoder produces a probability that the word is "fix" of 45% and that the word is "fax" of 55%, then, based upon the word frequency distribution, the decoder may alter the probabilities such that "fix" is given a 60% probability and "fax" is given a 40% probability. As with the path costs, the probabilities may be modified to favor certain decoding possibilities by increasing the probability of that decoding, decreasing the probability of other decoding possibilities, or both. By increasing the probabilities of more probable decoding possibilities or reducing the probabilities of other less-likely decoding probabilities, this increases the chances that the decoder selects a given decoding based upon the decoding feedback.

The amount that the path cost and/or probabilities are changed may be a specified predetermined amount; or may be dependent on the decoding feedback information. For example, the decoding feedback information may include a confidence factor or level. In the case of the word frequency distribution examples, this may correspond to the frequency of usage of particular terms. The amount may be set based upon a value calculated using a formula and this confidence factor or level. The higher the confidence factor or level the more the higher the change to the path cost and/or probabilities. In some examples, for the word usage frequency examples, each possible decoding may be adjusted based upon the usage frequency. This establishes a relative change for each term. That is, if we have three decoding possibilities: "fix," "fax" and "wax," and the word frequency distribution is that fix is used more frequently than fax and fax is used more frequently than wax; then the path cost of fix is reduced more than fax and the path cost of fax is reduced more than the path cost of wax. The result is that the likelihood of the decoder decoding a word that is used more frequently is increased. Since the decoder's decision isn't forced (only assisted) by the feedback, it's still possible that the decoder decodes a non-frequently used word.

In other examples in which the feedback information is feedback about previously decoded data, the system may "rewind" the decoder state to the state the decoder was in prior to the data of which the decoder received the feedback for. Thus, the decoder may have a memory that stores previous state information. The decoder may then replay the decoding, but substituting the feedback information (e.g., what the data should have been)—in the process correcting the decoding state. In yet another examples, the system may simply reconstruct the state using the feedback information by adjusting the paths, probabilities, and/or the like.

Figure 16:
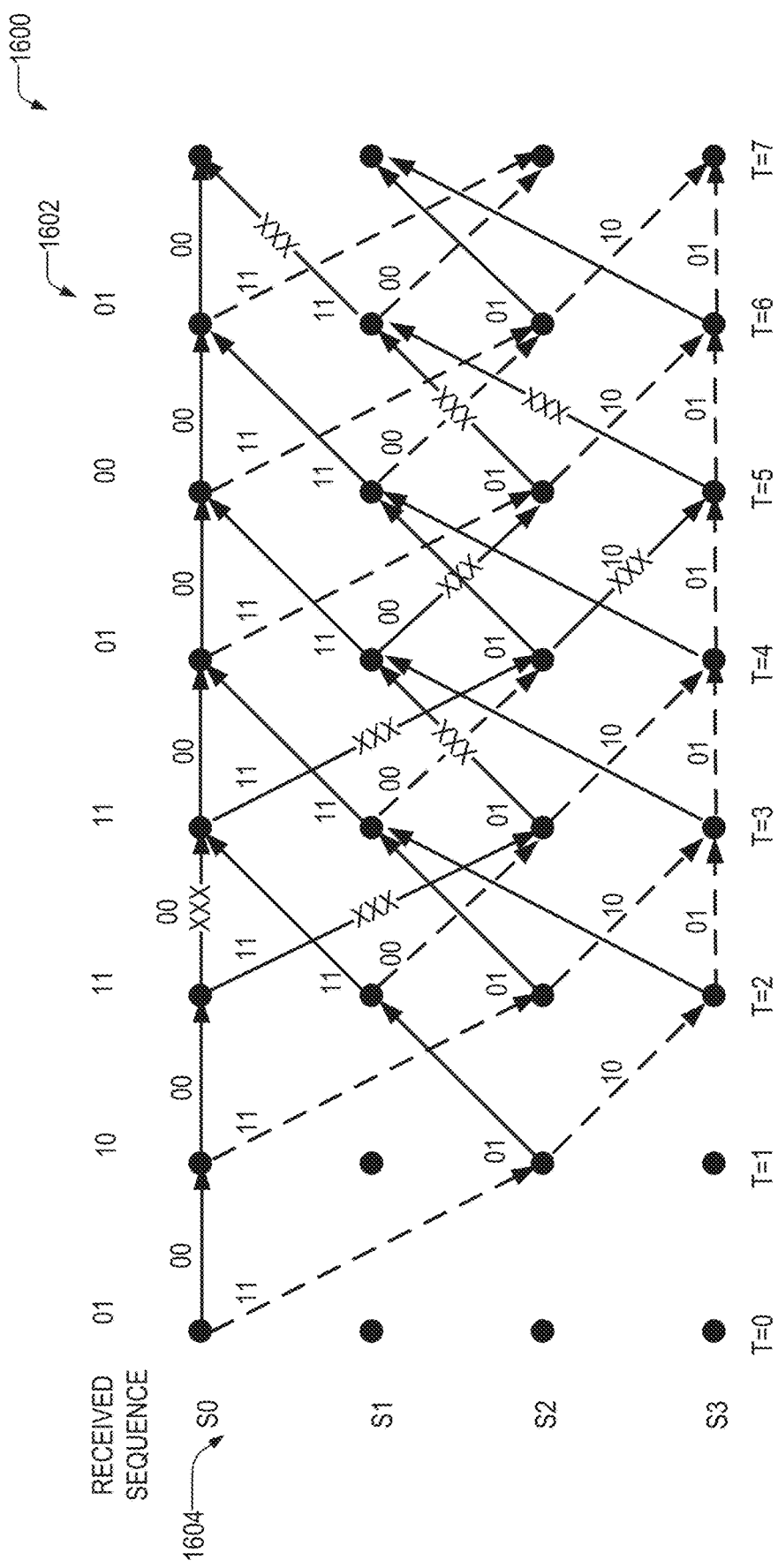
FIG. 16 illustrates an example of using corrected information to update a decision trellis of the decoder according to some examples of the present disclosure.

In still other examples, the system may prune one or more trellis paths based upon the feedback information. FIG. 16 illustrates an example of using corrected information to update a decision trellis 1600 of the decoder according to some examples of the present disclosure. An example of a received sequence 1602 is shown as columns across the top (01, 10, 11, 11, 01, 00, 01), along with the decoder state 1604. At each path, the valid transitions are displayed. For example, at S0, the valid transitions are 00 and 11. The arrow shows the next state based upon the transition. For example, from state S0, a bit pattern of 11 transitions the decoder to the state S2. The decoder, for each path, determines both a branch metric and a path metric. The branch metric, in some examples, may be the cost from moving from one state to the next. For example, with a received sequence of 01, the cost to move from state S0 to S2 is 1 as there is 1 difference between 01 and 11. The path metric may be a computed by first adding the branch metric to the path metric for the old state; comparing the sums for paths arriving at the new state (there are only two paths in the example of FIG. 3); and selecting the path with the smallest value. In some examples, ties may be broken arbitrarily. The feedback information may show that some paths, marked with "XXX" are not likely to be correct. These paths may be removed; given large path costs; or the like to avoid consideration.

Figure 17:
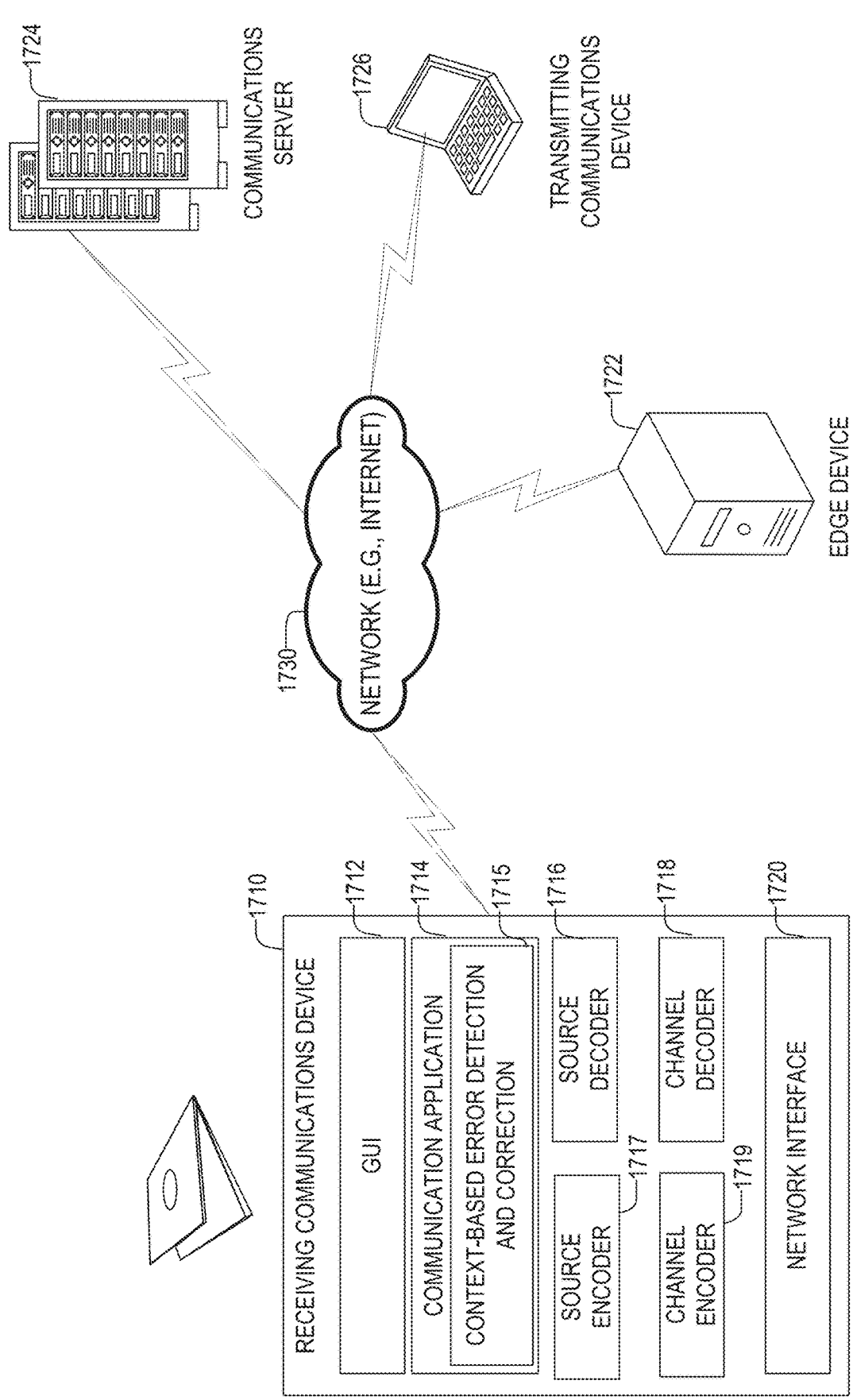
FIG. 17 illustrates a system of an improved decoder according to some examples of the present disclosure.

FIG. 17 illustrates a system 1700 of an improved decoder according to some examples of the present disclosure. A transmitting communications device 1726 transmits channel and/or source encoded data to the receiving computing device 1710 over a network, such as network 1730. In some examples, the transmission is from transmitting communications device 1726 through network 1730 to receiving computing device 1710, but in other examples, the data flows through communications server 1724. For example, communications server 1724 may compose a video or other file from the data sent from transmitting communications device 1726, and one or more other devices (including in some examples, data transmitted by receiving computing device 1710). For example, if the data sent by transmitting communications device 1726 is associated with a communication session such as an online meeting, video, audio, and other data may be composited together by the communications server 1724 to form the meeting. In some examples, the stream from the transmitting communications device 1726 may be separated into a BL and one or more EL as shown in FIG. 13. Similarly, the edge device 1722 may store one or more of the BL and EL. The details of the transmitting communications device 1726 are not shown for clarity, but in some examples, may be or include the same components as receiving computing device 1710.

Communications devices including the receiving computing device 1710 and, in some examples, the transmitting communications device 1726 may include a network interface 1720 such as an Ethernet interface, a WI-FI interface, or the like. The network interface 1720 may include one or more physical protocol layers. Channel decoder 1718 may decode one or more channel codes for received data. Source decoder 1716 may source decode the channel decoded data output from the channel decoder 1718. For data being transmitted, the source encoder 1717 source encodes the data and the channel encoder channel encodes the data 1719 before transmitting it through the network interface 1720.

The source decoded data is then passed to an application layer application such as a communication application 1714. In some examples, the communication application 1714 may also include the source encoder/decoder and/or the channel encoder/decoder. Context-based error detection and correction component 1715 is an example of context-based error detection and correction component described herein. Graphical user interface component 1712 may provide one or more GUIs that may display the data received. For example, display video, play audio, display text, or the like.

As used throughout the disclosure, the specific arrangement and composition of the various components are exemplary and a person of ordinary skill in the art with the benefit of the present disclosure will appreciate that other configurations are possible.

Figure 18:
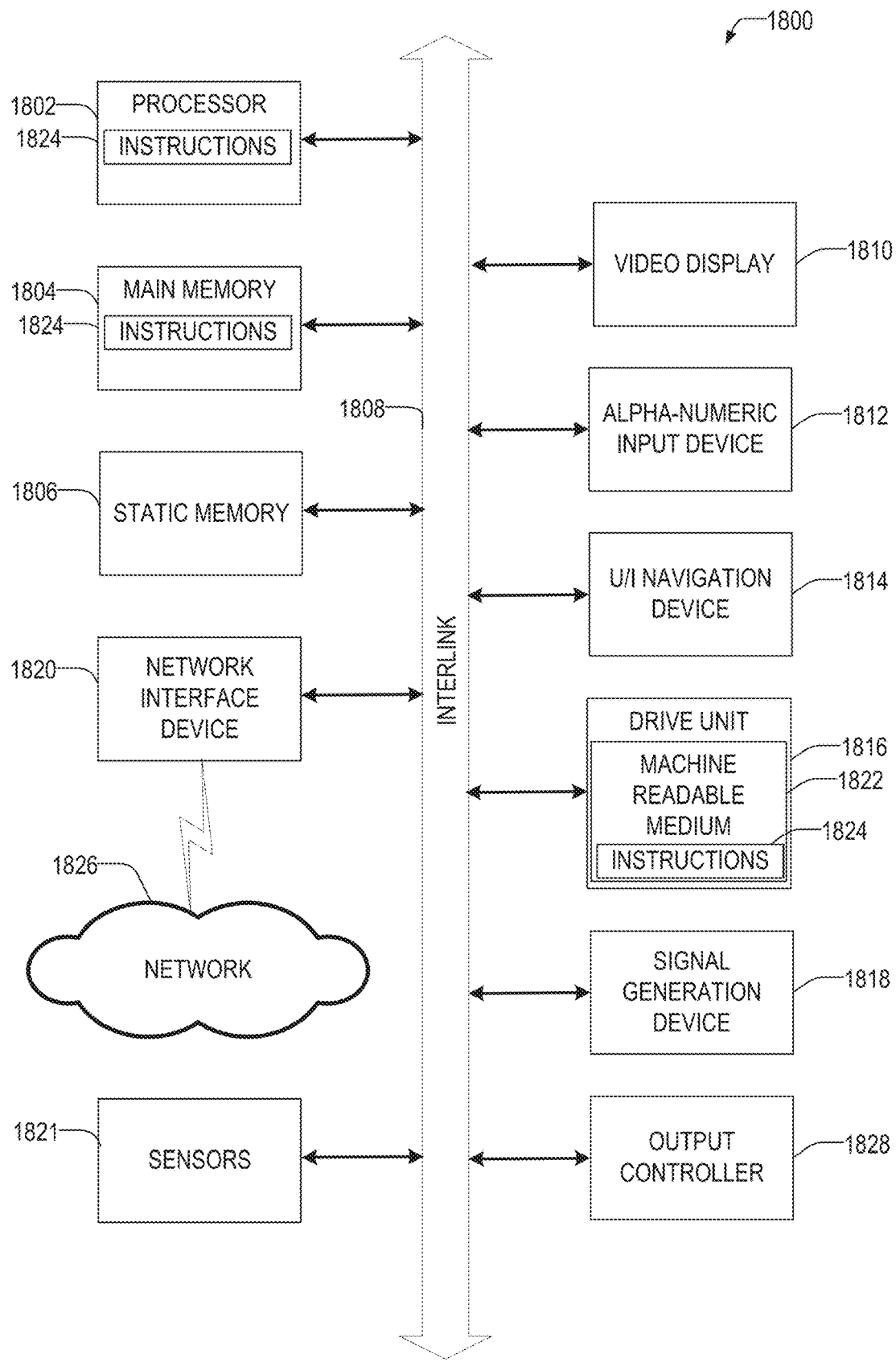
FIG. 18 is a block diagram illustrating an example of a machine upon which one or more embodiments may be implemented.

FIG. 18 illustrates a block diagram of an example machine 1800 upon which any one or more of the techniques (e.g., methodologies) discussed herein may be performed. In alternative embodiments, the machine 1800 may operate as a standalone device or may be connected (e.g., networked) to other machines. In a networked deployment, the machine 1800 may operate in the capacity of a server machine, a client machine, or both in server-client network environments. In an example, the machine 1800 may act as a peer machine in peer-to-peer (P2P) (or other distributed) network environment. The machine 1800 may be in the form of a personal computer (PC), a tablet PC, a set-top box (STB), a personal digital assistant (PDA), a server computer, a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. In some examples, machine 1800 may be configured to implement the transmitter 110, receiver 120, the decoding process of FIGS. 2,3,5-8, 10, 11, 14, and 15; the methods of FIGS. 4, 9, 12, and 19; the edge device 1320, the communication server 1310, the transmitting device 1305, the receiving device 1325 of FIG. 13, implement (e.g., in a data structure) the trellis of FIG. 16; the receiving computing device 1710, transmitting communications device 1726, the communications server 1724, the edge device 1722 of FIG. 17; and any other network-based service or computing device herein described.

Examples, as described herein, may include, or may operate on one or more logic units, components, or mechanisms (hereinafter "components"). Components are tangible entities (e.g., hardware) capable of performing specified operations and may be configured or arranged in a certain manner. In an example, circuits may be arranged (e.g., internally or with respect to external entities such as other circuits) in a specified manner as a component. In an example, the whole or part of one or more computer systems (e.g., a standalone, client or server computer system) or one or more hardware processors may be configured by firmware or software (e.g., instructions, an application portion, or an application) as a component that operates to perform specified operations. In an example, the software may reside on a machine readable medium. In an example, the software, when executed by the underlying hardware of the component, causes the hardware to perform the specified operations of the component.

Accordingly, the term "component" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which component are temporarily configured, each of the components need not be instantiated at any one moment in time. For example, where the components comprise a general-purpose hardware processor configured using software, the general-purpose hardware processor may be configured as respective different components at different times. Software may accordingly configure a hardware processor, for example, to constitute a particular module at one instance of time and to constitute a different component at a different instance of time.

Machine (e.g., computer system) 1800 may include one or more hardware processors, such as processor 1802. Processor 1802 may be a central processing unit (CPU), a graphics processing unit (GPU), a hardware processor core, or any combination thereof. Machine 1800 may include a main memory 1804 and a static memory 1806, some or all of which may communicate with each other via an interlink (e.g., bus) 1808. Examples of main memory 1804 may include Synchronous Dynamic Random-Access Memory (SDRAM), such as Double Data Rate memory, such as DDR4 or DDR5. Interlink 1808 may be one or more different types of interlinks such that one or more components may be connected using a first type of interlink and one or more components may be connected using a second type of interlink. Example interlinks may include a memory bus, a peripheral component interconnect (PCI), a peripheral component interconnect express (PCIe) bus, a universal serial bus (USB), or the like.

The machine 1800 may further include a display unit 1810, an alphanumeric input device 1812 (e.g., a keyboard), and a user interface (UI) navigation device 1814 (e.g., a mouse). In an example, the display unit 1810, input device 1812 and UI navigation device 1814 may be a touch screen display. The machine 1800 may additionally include a storage device (e.g., drive unit) 1816, a signal generation device 1818 (e.g., a speaker), a network interface device 1820, and one or more sensors 1821, such as a global positioning system (GPS) sensor, compass, accelerometer, or other sensor. The machine 1800 may include an output controller 1828, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1816 may include a machine readable medium 1822 on which is stored one or more sets of data structures or instructions 1824 (e.g., software) embodying or utilized by any one or more of the techniques or functions described herein. The instructions 1824 may also reside, completely or at least partially, within the main memory 1804, within static memory 1806, or within the hardware processor 1802 during execution thereof by the machine 1800. In an example, one or any combination of the hardware processor 1802, the main memory 1804, the static memory 1806, or the storage device 1816 may constitute machine readable media.

While the machine readable medium 1822 is illustrated as a single medium, the term "machine readable medium" may include a single medium or multiple media (e.g., a centralized or distributed database, and/or associated caches and servers) configured to store the one or more instructions 1824.

The term "machine readable medium" may include any medium that is capable of storing, encoding, or carrying instructions for execution by the machine 1800 and that cause the machine 1800 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); Solid State Drives (SSD); and CD-ROM and DVD-ROM disks. In some examples, machine readable media may include non-transitory machine readable media. In some examples, machine readable media may include machine readable media that is not a transitory propagating signal.

The instructions 1824 may further be transmitted or received over a communications network 1826 using a transmission medium via the network interface device 1820. The Machine 1800 may communicate with one or more other machines wired or wirelessly utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks such as an Institute of Electrical and Electronics Engineers (IEEE) 802.11 family of standards known as Wi-Fi®, an IEEE 802.15.4 family of standards, a 5G New Radio (NR) family of standards, a Long Term Evolution (LTE) family of standards, a Universal Mobile Telecommunications System (UMTS) family of standards, peer-to-peer (P2P) networks, among others. In an example, the network interface device 1820 may include one or more physical jacks (e.g., Ethernet, coaxial, or phone jacks) or one or more antennas to connect to the communications network 1826. In an example, the network interface device 1820 may include a plurality of antennas to wirelessly communicate using at least one of single-input multiple-output (SIMO), multiple-input multiple-output (MIMO), or multiple-input single-output (MISO) techniques. In some examples, the network interface device 1820 may wirelessly communicate using Multiple User MIMO techniques.

Other Notes and Examples

Example 1 is a method of improving decoding performance using language checking or predictive text, the method comprising: receiving, over a transmission medium, encoded text encoded with an error correction code; decoding, by a decoder, at least a portion of the encoded text to produce a decoded text portion; running a language check on the decoded text portion to produce a corrected decoded text portion, or inputting the decoded text portion into a predictive text generator, the predictive text generator generating subsequent text to produce a predicted decoded next text portion, the language check comprising a spelling check or a grammar check; encoding, using the error correction code, the corrected decoded text portion or the predicted decoded next text portion to produce encoded feedback information, eliminating at least one potential decoding possibility by utilizing the encoded feedback information when decoding, by the decoder, a second portion of the encoded text to create a second decoded text portion; and displaying the second decoded text portion of the encoded text on a display.

In Example 2, the subject matter of Example 1 includes, wherein eliminating at least one potential decoding comprises trimming a trellis by eliminating choices inconsistent with the encoded feedback information.

In Example 3, the subject matter of Examples 1-2 includes, wherein spell checking the decoded text portion comprises utilizing context sensitive spell checking that scans a plurality of words to determine improper spelling.

In Example 4, the subject matter of Example 3 includes, wherein the context sensitive spell checking utilizes historical usage of a transmitting user.

In Example 5, the subject matter of Examples 1-4 includes, wherein the predictive text generator utilizes historical word choices of a transmitting user.

In Example 6, the subject matter of Examples 1-5 includes, wherein the decoder is a trellis decoder.

In Example 7, the subject matter of Examples 1-6 includes, wherein the language check comprises determining a most probable word based upon a word frequency usage of a transmitting user.

Example 8 is a computing device for improving decoding performance using language checking or predictive text, the computing device comprising: a hardware processor; a memory, storing instructions, which when executed by the hardware processor causes the computing device to perform operations comprising: receiving, over a transmission medium, encoded text encoded with an error correction code; decoding, by a decoder, at least a portion of the encoded text to produce a decoded text portion; running a language check on the decoded text portion to produce a corrected decoded text portion, or inputting the decoded text portion into a predictive text generator, the predictive text generator generating subsequent text to produce a predicted decoded next text portion, the language check comprising a spelling check or a grammar check; encoding, using the error correction code, the corrected decoded text portion or the predicted decoded next text portion to produce encoded feedback information; eliminating at least one potential decoding possibility by utilizing the encoded feedback information when decoding, by the decoder, a second portion of the encoded text to create a second decoded text portion; and displaying the second decoded text portion of the encoded text on a display.

In Example 9, the subject matter of Example 8 includes, wherein the operations of eliminating at least one potential decoding comprises trimming a trellis by eliminating choices inconsistent with the encoded feedback information.

In Example 10, the subject matter of Examples 8-9 includes, wherein the operations of spell checking the decoded text portion comprises utilizing context sensitive spell checking that scans a plurality of words to determine improper spelling.

In Example 11, the subject matter of Example 10 includes, wherein the context sensitive spell checking utilizes historical usage of a transmitting user.

In Example 12, the subject matter of Examples 8-11 includes, wherein the predictive text generator utilizes historical word choices of a transmitting user.

In Example 13, the subject matter of Examples 8-12 includes, wherein the decoder is a trellis decoder.

In Example 14, the subject matter of Examples 8-13 includes, wherein the language check comprises determining a most probable word based upon a word frequency usage of a transmitting user.

Example 15 is a machine-readable medium, storing instructions for improving decoding performance using language checking or predictive text, the instructions, which when executed, cause a machine to perform operations comprising: receiving, over a transmission medium, encoded text encoded with an error correction code; decoding, by a decoder, at least a portion of the encoded text to produce a decoded text portion; running a language check on the decoded text portion to produce a corrected decoded text portion, or inputting the decoded text portion into a predictive text generator, the predictive text generator generating subsequent text to produce a predicted decoded next text portion, the language check comprising a spelling check or a grammar check; encoding, using the error correction code, the corrected decoded text portion or the predicted decoded next text portion to produce encoded feedback information; eliminating at least one potential decoding possibility by utilizing the encoded feedback information when decoding, by the decoder, a second portion of the encoded text to create a second decoded text portion; and displaying the second decoded text portion of the encoded text on a display.

In Example 16, the subject matter of Example 15 includes, wherein the operations of eliminating at least one potential decoding comprises trimming a trellis by eliminating choices inconsistent with the encoded feedback information.

In Example 17, the subject matter of Examples 15-16 includes, wherein the operations of spell checking the decoded text portion comprises utilizing context sensitive spell checking that scans a plurality of words to determine improper spelling.

In Example 18, the subject matter of Example 17 includes, wherein the context sensitive spell checking utilizes historical usage of a transmitting user.

In Example 19, the subject matter of Examples 15-18 includes, wherein the predictive text generator utilizes historical word choices of a transmitting user.

In Example 20, the subject matter of Examples 15-19 includes, wherein the decoder is a trellis decoder.

In Example 21, the subject matter of Examples 15-20 includes, wherein the language check comprises determining a most probable word based upon a word frequency usage of a transmitting user.

Example 22 is a device for improving decoding performance using language checking or predictive text, the device comprising: means for receiving, over a transmission medium, encoded text encoded with an error correction code; means for decoding, by a decoder, at least a portion of the encoded text to produce a decoded text portion; means for running a language check on the decoded text portion to produce a corrected decoded text portion, or inputting the decoded text portion into a predictive text generator, the predictive text generator generating subsequent text to produce a predicted decoded next text portion, the language check comprising a spelling check or a grammar check; means for encoding, using the error correction code, the corrected decoded text portion or the predicted decoded next text portion to produce encoded feedback information; means for eliminating at least one potential decoding possibility by utilizing the encoded feedback information when decoding, by the decoder, a second portion of the encoded text to create a second decoded text portion; and means for displaying the second decoded text portion of the encoded text on a display.

In Example 23, the subject matter of Example 22 includes, wherein the means for eliminating at least one potential decoding comprises means for trimming a trellis by eliminating choices inconsistent with the encoded feedback information.

In Example 24, the subject matter of Examples 22-23 includes, wherein the spell checking the decoded text portion comprises utilizing context sensitive spell checking that scans a plurality of words to determine improper spelling.

In Example 25, the subject matter of Example 24 includes, wherein the context sensitive spell checking utilizes historical usage of a transmitting user.

In Example 26, the subject matter of Examples 22-25 includes, wherein the predictive text generator utilizes historical word choices of a transmitting user.

In Example 27, the subject matter of Examples 22-26 includes, wherein the decoder is a trellis decoder.

In Example 28, the subject matter of Examples 22-27 includes, wherein the language check comprises means for determining a most probable word based upon a word frequency usage of a transmitting user.

Example 29 is a method of improving decoder performance using a characteristic of a voice of a speaker, the method comprising: receiving, over a network, the characteristic of the voice of the speaker; receiving encoded speech data of the speaker; decoding a first portion of the encoded speech data of the speaker using a decoder to produce decoded speech data; comparing the decoded speech data with the received characteristic of the voice of the speaker; determining that the decoded speech data does not correspond to the received characteristic of the speaker based upon a result of the comparing the decoded speech data with the received characteristic of the voice of the speaker; and responsive to determining that the decoded speech data does not correspond to the received characteristic of the speaker: correcting the decoded speech data based upon the characteristic of the voice of the speaker to create corrected speech data; and eliminating at least one potential decoding possibility by utilizing the corrected speech data when decoding, by the decoder, a second portion of the encoded speech data to create a second decoded speech data.

In Example 30, the subject matter of Example 29 includes, wherein the correcting the decoded speech data based upon the characteristic of the voice of the speaker to create corrected decoded speech data comprises using a deep learning neural network.

In Example 31, the subject matter of Examples 29-30 includes, wherein the characteristic comprises mel frequency cepstral coefficients.

In Example 32, the subject matter of Examples 29-31 includes, wherein the characteristic is one of: transmitted by the speaker as part of a communication session or received from a network-based service.

In Example 33, the subject matter of Example 32 includes, wherein the characteristic is transmitted by the speaker as part of speech during the communication session.

In Example 34, the subject matter of Examples 29-33 includes, encoding the corrected speech data to create encoded corrected speech data; and wherein eliminating the at least one potential decoding possibility by utilizing the corrected speech data when decoding, by the decoder, the second portion of the encoded speech data to create the second decoded speech data comprises utilizing the encoded corrected speech data.

In Example 35, the subject matter of Examples 29-34 includes, wherein determining that the decoded speech data does not correspond to the characteristic of the speaker based upon the result of the comparing of the decoded speech data with the characteristic of the voice of the speaker comprises using the decoded speech data and the characteristic of the speaker as input to a deep learning network.

In Example 36, the subject matter of Examples 29-35 includes, wherein determining that the decoded speech data does not correspond to the characteristic of the speaker based upon the result of the comparing of the decoded speech data with the characteristic of the voice of the speaker comprises: using the characteristic of the speaker to create a transcription of the decoded speech data; identifying a first word in the transcription used less than a specified frequency in word frequency distribution data of the speaker; responsive to identifying the first word, changing the first word in the transcription to a second word, the second word used more than a second specified frequency to create an updated transcript; and wherein correcting the decoded speech data to correspond the characteristic of the voice of the speaker to create the corrected speech data comprises applying a deep learning neural network to the updated transcript to create the corrected speech data.

In Example 37, the subject matter of Examples 29-36 includes, wherein eliminating the at least one potential decoding possibility by utilizing the corrected speech data when decoding, by the decoder, the second portion of the encoded speech data to create the second decoded speech data comprises one of: trimming a decoder trellis, updating a path cost, or re-decoding the first portion prior to decoding the second portion.

In Example 38, the subject matter of Examples 29-37 includes, wherein receiving, over the network, the characteristic of the voice of the speaker comprises calculating the characteristic using previously received speech data of the speaker.

In Example 39, the subject matter of Examples 29-38 includes, wherein receiving over the network the characteristic of the voice of the speaker comprises receiving the characteristic without calculating the characteristic from previously received speech data of the speaker.

In Example 40, the subject matter of Examples 29-39 includes, wherein determining that the decoded speech data does not correspond to the received characteristic of the speaker based upon the result of the comparing the decoded speech data with the received characteristic of the voice of the speaker comprises determining that one or more of a frequency, amplitude, cadence, tone, or one or more mel frequency cepstrum coefficients of the decoded speech data are a prespecified threshold above or below a corresponding characteristic of the speaker.

In Example 41, the subject matter of Examples 29-40 includes, wherein eliminating the at least one potential decoding possibility by utilizing the corrected speech data when decoding, by the decoder, the second portion of the encoded speech data to create the second decoded speech data comprises one of: removing a path through a trellis data structure, increasing a path cost for the potential decoding possibility, or decreasing a probability metric for the potential decoding possibility.

Example 42 is a computing device for improving decoder performance using a characteristic of a voice of a speaker, the computing device comprising: a hardware processor; a memory, the memory storing instructions, which when executed by the hardware processor, causes the computing device to perform operations comprising: receiving, over a network, the characteristic of the voice of the speaker; receiving encoded speech data of the speaker; decoding a first portion of the encoded speech data of the speaker using a decoder to produce decoded speech data; comparing the decoded speech data with the received characteristic of the voice of the speaker; determining that the decoded speech data does not correspond to the received characteristic of the speaker based upon a result of the comparing the decoded speech data with the received characteristic of the voice of the speaker; and responsive to determining that the decoded speech data does not correspond to the received characteristic of the speaker: correcting the decoded speech data based upon the characteristic of the voice of the speaker to create corrected speech data; and eliminating at least one potential decoding possibility by utilizing the corrected speech data when decoding, by the decoder, a second portion of the encoded speech data to create a second decoded speech data.

In Example 43, the subject matter of Example 42 includes, wherein the operations of correcting the decoded speech data based upon the characteristic of the voice of the speaker to create corrected decoded speech data comprises using a deep learning neural network.

In Example 44, the subject matter of Examples 42-43 includes, wherein the characteristic comprises mel frequency cepstral coefficients.

In Example 45, the subject matter of Examples 42-44 includes, wherein the characteristic is one of: transmitted by the speaker as part of a communication session or received from a network-based service.

In Example 46, the subject matter of Example 45 includes, wherein the characteristic is transmitted by the speaker as part of speech during the communication session.

In Example 47, the subject matter of Examples 42-46 includes, wherein the operations further comprise: encoding the corrected speech data to create encoded corrected speech data; and wherein eliminating the at least one potential decoding possibility by utilizing the corrected speech data when decoding, by the decoder, the second portion of the encoded speech data to create the second decoded speech data comprises utilizing the encoded corrected speech data.

In Example 48, the subject matter of Examples 42-47 includes, wherein the operations of determining that the decoded speech data does not correspond to the characteristic of the speaker based upon the result of the comparing of the decoded speech data with the characteristic of the voice of the speaker comprises using the decoded speech data and the characteristic of the speaker as input to a deep learning network.

In Example 49, the subject matter of Examples 42-48 includes, wherein the operations of determining that the decoded speech data does not correspond to the characteristic of the speaker based upon the result of the comparing of the decoded speech data with the characteristic of the voice of the speaker comprises: using the characteristic of the speaker to create a transcription of the decoded speech data; identifying a first word in the transcription used less than a specified frequency in word frequency distribution data of the speaker; responsive to identifying the first word, changing the first word in the transcription to a second word, the second word used more than a second specified frequency to create an updated transcript; and wherein correcting the decoded speech data to correspond the characteristic of the voice of the speaker to create the corrected speech data comprises applying a deep learning neural network to the updated transcript to create the corrected speech data.

In Example 50, the subject matter of Examples 42-49 includes, wherein the operations of eliminating the at least one potential decoding possibility by utilizing the corrected speech data when decoding, by the decoder, the second portion of the encoded speech data to create the second decoded speech data comprises one of: trimming a decoder trellis, updating a path cost, or re-decoding the first portion prior to decoding the second portion.

In Example 51, the subject matter of Examples 42-50 includes, wherein the operations of receiving, over the network, the characteristic of the voice of the speaker comprises calculating the characteristic using previously received speech data of the speaker.

In Example 52, the subject matter of Examples 42-51 includes, wherein the operations of receiving over the network the characteristic of the voice of the speaker comprises receiving the characteristic without calculating the characteristic from previously received speech data of the speaker.

In Example 53, the subject matter of Examples 42-52 includes, wherein the operations of determining that the decoded speech data does not correspond to the received characteristic of the speaker based upon the result of the comparing the decoded speech data with the received characteristic of the voice of the speaker comprises determining that one or more of a frequency, amplitude, cadence, tone, or one or more mel frequency cepstrum coefficients of the decoded speech data are a prespecified threshold above or below a corresponding characteristic of the speaker.

In Example 54, the subject matter of Examples 42-53 includes, wherein the operations of eliminating the at least one potential decoding possibility by utilizing the corrected speech data when decoding, by the decoder, the second portion of the encoded speech data to create the second decoded speech data comprises one of: removing a path through a trellis data structure, increasing a path cost for the potential decoding possibility, or decreasing a probability metric for the potential decoding possibility.

Example 55 is a machine-readable medium, storing instructions for improving decoder performance using a characteristic of a voice of a speaker, the instructions, when executed by a machine, cause the machine to perform operations comprising: receiving, over a network, the characteristic of the voice of the speaker; receiving encoded speech data of the speaker; decoding a first portion of the encoded speech data of the speaker using a decoder to produce decoded speech data; comparing the decoded speech data with the received characteristic of the voice of the speaker, determining that the decoded speech data does not correspond to the received characteristic of the speaker based upon a result of the comparing the decoded speech data with the received characteristic of the voice of the speaker; and responsive to determining that the decoded speech data does not correspond to the received characteristic of the speaker: correcting the decoded speech data based upon the characteristic of the voice of the speaker to create corrected speech data; and eliminating at least one potential decoding possibility by utilizing the corrected speech data when decoding, by the decoder, a second portion of the encoded speech data to create a second decoded speech data.

In Example 56, the subject matter of Example 55 includes, wherein the operations of correcting the decoded speech data based upon the characteristic of the voice of the speaker to create corrected decoded speech data comprises using a deep learning neural network.

In Example 57, the subject matter of Examples 55-56 includes, wherein the characteristic comprises mel frequency cepstral coefficients.

In Example 58, the subject matter of Examples 55-57 includes, wherein the characteristic is one of: transmitted by the speaker as part of a communication session or received from a network-based service.

In Example 59, the subject matter of Example 58 includes, wherein the characteristic is transmitted by the speaker as part of speech during the communication session.

In Example 60, the subject matter of Examples 55-59 includes, wherein the operations further comprise: encoding the corrected speech data to create encoded corrected speech data; and wherein eliminating the at least one potential decoding possibility by utilizing the corrected speech data when decoding, by the decoder, the second portion of the encoded speech data to create the second decoded speech data comprises utilizing the encoded corrected speech data.

In Example 61, the subject matter of Examples 55-60 includes, wherein the operations of determining that the decoded speech data does not correspond to the characteristic of the speaker based upon the result of the comparing of the decoded speech data with the characteristic of the voice of the speaker comprises using the decoded speech data and the characteristic of the speaker as input to a deep learning network.

In Example 62, the subject matter of Examples 55-61 includes, wherein the operations of determining that the decoded speech data does not correspond to the characteristic of the speaker based upon the result of the comparing of the decoded speech data with the characteristic of the voice of the speaker comprises: using the characteristic of the speaker to create a transcription of the decoded speech data; identifying a first word in the transcription used less than a specified frequency in word frequency distribution data of the speaker; responsive to identifying the first word, changing the first word in the transcription to a second word, the second word used more than a second specified frequency to create an updated transcript; and wherein correcting the decoded speech data to correspond the characteristic of the voice of the speaker to create the corrected speech data comprises applying a deep learning neural network to the updated transcript to create the corrected speech data.

In Example 63, the subject matter of Examples 55-62 includes, wherein the operations of eliminating the at least one potential decoding possibility by utilizing the corrected speech data when decoding, by the decoder, the second portion of the encoded speech data to create the second decoded speech data comprises one of: trimming a decoder trellis, updating a path cost, or re-decoding the first portion prior to decoding the second portion.

In Example 64, the subject matter of Examples 55-63 includes, wherein the operations of receiving, over the network, the characteristic of the voice of the speaker comprises calculating the characteristic using previously received speech data of the speaker.

In Example 65, the subject matter of Examples 55-64 includes, wherein the operations of receiving over the network the characteristic of the voice of the speaker comprises receiving the characteristic without calculating the characteristic from previously received speech data of the speaker.

In Example 66, the subject matter of Examples 55-65 includes, wherein the operations of determining that the decoded speech data does not correspond to the received characteristic of the speaker based upon the result of the comparing the decoded speech data with the received characteristic of the voice of the speaker comprises determining that one or more of a frequency, amplitude, cadence, tone, or one or more mel frequency cepstrum coefficients of the decoded speech data are a prespecified threshold above or below a corresponding characteristic of the speaker.

In Example 67, the subject matter of Examples 55-66 includes, wherein the operations of eliminating the at least one potential decoding possibility by utilizing the corrected speech data when decoding, by the decoder, the second portion of the encoded speech data to create the second decoded speech data comprises one of: removing a path through a trellis data structure, increasing a path cost for the potential decoding possibility, or decreasing a probability metric for the potential decoding possibility.

Example 68 is a device for improving decoder performance using a characteristic of a voice of a speaker, the device comprising: means for receiving, over a network, the characteristic of the voice of the speaker; means for receiving encoded speech data of the speaker; means for decoding a first portion of the encoded speech data of the speaker using a decoder to produce decoded speech data; means for comparing the decoded speech data with the received characteristic of the voice of the speaker, means for determining that the decoded speech data does not correspond to the received characteristic of the speaker based upon a result of the comparing the decoded speech data with the received characteristic of the voice of the speaker; and responsive to determining that the decoded speech data does not correspond to the received characteristic of the speaker: means for correcting the decoded speech data based upon the characteristic of the voice of the speaker to create corrected speech data; and means for eliminating at least one potential decoding possibility by utilizing the corrected speech data when decoding, by the decoder, a second portion of the encoded speech data to create a second decoded speech data.

In Example 69, the subject matter of Example 68 includes, wherein the means for correcting the decoded speech data based upon the characteristic of the voice of the speaker to create corrected decoded speech data comprises using a deep learning neural network.

In Example 70, the subject matter of Examples 68-69 includes, wherein the characteristic comprises mel frequency cepstral coefficients.

In Example 71, the subject matter of Examples 68-70 includes, wherein the characteristic is one of: transmitted by the speaker as part of a communication session or received from a network-based service.

In Example 72, the subject matter of Example 71 includes, wherein the characteristic is transmitted by the speaker as part of speech during the communication session.

In Example 73, the subject matter of Examples 68-72 includes, means for encoding the corrected speech data to create encoded corrected speech data; and wherein the means for eliminating the at least one potential decoding possibility by utilizing the corrected speech data when decoding, by the decoder, the second portion of the encoded speech data to create the second decoded speech data comprises means for utilizing the encoded corrected speech data.

In Example 74, the subject matter of Examples 68-73 includes, wherein the means for determining that the decoded speech data does not correspond to the characteristic of the speaker based upon the result of the comparing of the decoded speech data with the characteristic of the voice of the speaker comprises means for using the decoded speech data and the characteristic of the speaker as input to a deep learning network.

In Example 75, the subject matter of Examples 68-74 includes, wherein the means for determining that the decoded speech data does not correspond to the characteristic of the speaker based upon the result of the comparing of the decoded speech data with the characteristic of the voice of the speaker comprises: means for using the characteristic of the speaker to create a transcription of the decoded speech data; means for identifying a first word in the transcription used less than a specified frequency in word frequency distribution data of the speaker; responsive to identifying the first word, means for changing the first word in the transcription to a second word, the second word used more than a second specified frequency to create an updated transcript; and wherein the means for correcting the decoded speech data to correspond the characteristic of the voice of the speaker to create the corrected speech data comprises means for applying a deep learning neural network to the updated transcript to create the corrected speech data.

In Example 76, the subject matter of Examples 68-75 includes, wherein the means for eliminating the at least one potential decoding possibility by utilizing the corrected speech data when decoding, by the decoder, the second portion of the encoded speech data to create the second decoded speech data comprises one of: trimming a decoder trellis, updating a path cost, or re-decoding the first portion prior to decoding the second portion.

In Example 77, the subject matter of Examples 68-76 includes, wherein the means for receiving, over the network, the characteristic of the voice of the speaker comprises means for calculating the characteristic using previously received speech data of the speaker.

In Example 78, the subject matter of Examples 68-77 includes, wherein the means for receiving over the network the characteristic of the voice of the speaker comprises means for receiving the characteristic without calculating the characteristic from previously received speech data of the speaker.

In Example 79, the subject matter of Examples 68-78 includes, wherein the means for determining that the decoded speech data does not correspond to the received characteristic of the speaker based upon the result of the comparing the decoded speech data with the received characteristic of the voice of the speaker comprises means for determining that one or more of a frequency, amplitude, cadence, tone, or one or more mel frequency cepstrum coefficients of the decoded speech data are a prespecified threshold above or below a corresponding characteristic of the speaker.

In Example 80, the subject matter of Examples 68-79 includes, wherein the means for eliminating the at least one potential decoding possibility by utilizing the corrected speech data when decoding, by the decoder, the second portion of the encoded speech data to create the second decoded speech data comprises one of: removing a path through a trellis data structure, increasing a path cost for the potential decoding possibility, or decreasing a probability metric for the potential decoding possibility.

Example 81 is a method for improving decoding performance of an image using object detection, the method comprising: receiving an encoded image; decoding a first portion of the encoded image to create a first decoded image portion; searching for at least one object in the first decoded image portion using an automated object recognition process; determining, based upon the automated object recognition process, that an error is present in the first decoded image portion, and, in response: correcting the first decoded image portion based upon the automated object recognition process to produce a corrected decoded image; encoding the corrected decoded image to create a corrected encoded image; decoding a second portion of the encoded image using the corrected encoded image to create a second corrected decoded image; and outputting the second corrected decoded image to a display device.

In Example 82, the subject matter of Example 81 includes, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the method further comprises: determining that the automated object recognition process did not meet a specified reliability metric; and responsive to determining that the automated object recognition process did not meet the specified reliability metric: requesting an additional layer encoding from a network device; and searching for the at least one object in the first decoded image portion using the additional layer encoding and the automated object recognition process.

In Example 83, the subject matter of Examples 81-82 includes, wherein performing the automated object recognition process comprises uses a deep learning neural network.

In Example 84, the subject matter of Examples 81-83 includes, wherein determining, based upon the automated object recognition process, that errors are present in the first decoded image portion comprises: receiving an identification of an object from a communication server; and determining that the object cannot be recognized in the first decoded image portion.

In Example 85, the subject matter of Examples 81-84 includes, wherein determining, based upon the automated object recognition process, that errors are present in the first decoded image portion comprises: receiving object information from a communication server; detecting the object in the first decoded image portion; and determining that the object does not match the object information.

In Example 86, the subject matter of Examples 81-85 includes, wherein decoding the first portion of the encoded image to create the first decoded image portion comprises using a channel decoder.

In Example 87, the subject matter of Example 86 includes, wherein the channel decoder is one of: a Viterbi decoder or a turbo decoder.

Example 88 is a computing device for improving decoding performance of an image using object detection, the computing device comprising: a hardware processor; a memory, the memory storing instructions, which when executed by the hardware processor, causes the computing device to perform operations comprising: receiving an encoded image; decoding a first portion of the encoded image to create a first decoded image portion; searching for at least one object in the first decoded image portion using an automated object recognition process; determining, based upon the automated object recognition process, that an error is present in the first decoded image portion, and, in response: correcting the first decoded image portion based upon the automated object recognition process to produce a corrected decoded image; encoding the corrected decoded image to create a corrected encoded image; decoding a second portion of the encoded image using the corrected encoded image to create a second corrected decoded image; and outputting the second corrected decoded image to a display device.

In Example 89, the subject matter of Example 88 includes, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the operations further comprise: determining that the automated object recognition process did not meet a specified reliability metric; and responsive to determining that the automated object recognition process did not meet the specified reliability metric; requesting an additional layer encoding from a network device; and searching for the at least one object in the first decoded image portion using the additional layer encoding and the automated object recognition process.

In Example 90, the subject matter of Examples 88-89 includes, wherein the operations of performing the automated object recognition process comprises uses a deep learning neural network.

In Example 91, the subject matter of Examples 88-90 includes, wherein the operations of determining, based upon the automated object recognition process, that errors are present in the first decoded image portion comprises: receiving an identification of an object from a communication server; and determining that the object cannot be recognized in the first decoded image portion.

In Example 92, the subject matter of Examples 88-91 includes, wherein the operations of determining, based upon the automated object recognition process, that errors are present in the first decoded image portion comprises: receiving object information from a communication server; detecting the object in the first decoded image portion; and determining that the object does not match the object information.

In Example 93, the subject matter of Examples 88-92 includes, wherein the operations of decoding the first portion of the encoded image to create the first decoded image portion comprises using a channel decoder.

In Example 94, the subject matter of Example 93 includes, wherein the channel decoder is one of: a Viterbi decoder or a turbo decoder.

Example 95 is a machine-readable medium, storing instructions for improving decoding performance of an image using object detection, the instructions, when executed by a machine, cause the machine to perform operations comprising: receiving an encoded image; decoding a first portion of the encoded image to create a first decoded image portion; searching for at least one object in the first decoded image portion using an automated object recognition process; determining, based upon the automated object recognition process, that an error is present in the first decoded image portion, and, in response: correcting the first decoded image portion based upon the automated object recognition process to produce a corrected decoded image; encoding the corrected decoded image to create a corrected encoded image; decoding a second portion of the encoded image using the corrected encoded image to create a second corrected decoded image; and outputting the second corrected decoded image to a display device.

In Example 96, the subject matter of Example 95 includes, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the operations further comprise: determining that the automated object recognition process did not meet a specified reliability metric; and responsive to determining that the automated object recognition process did not meet the specified reliability metric: requesting an additional layer encoding from a network device; and searching for the at least one object in the first decoded image portion using the additional layer encoding and the automated object recognition process.

In Example 97, the subject matter of Examples 95-96 includes, wherein the operations of performing the automated object recognition process comprises uses a deep learning neural network.

In Example 98, the subject matter of Examples 95-97 includes, wherein the operations of determining, based upon the automated object recognition process, that errors are present in the first decoded image portion comprises: receiving an identification of an object from a communication server; and determining that the object cannot be recognized in the first decoded image portion.

In Example 99, the subject matter of Examples 95-98 includes, wherein the operations of determining, based upon the automated object recognition process, that errors are present in the first decoded image portion comprises: receiving object information from a communication server; detecting the object in the first decoded image portion; and determining that the object does not match the object information.

In Example 100, the subject matter of Examples 95-99 includes, wherein the operations of decoding the first portion of the encoded image to create the first decoded image portion comprises using a channel decoder.

In Example 101, the subject matter of Example 100 includes, wherein the channel decoder is one of: a Viterbi decoder or a turbo decoder.

Example 102 is a device for improving decoding performance of an image using object detection, the device comprising: means for receiving an encoded image; means for decoding a first portion of the encoded image to create a first decoded image portion; means for searching for at least one object in the first decoded image portion using an automated object recognition process; means for determining, based upon the automated object recognition process, that an error is present in the first decoded image portion, and, in response: means for correcting the first decoded image portion based upon the automated object recognition process to produce a corrected decoded image; means for encoding the corrected decoded image to create a corrected encoded image; means for decoding a second portion of the encoded image using the corrected encoded image to create a second corrected decoded image; and means for outputting the second corrected decoded image to a display device.

In Example 103, the subject matter of Example 102 includes, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the device further comprises: means for determining that the automated object recognition process did not meet a specified reliability metric; and responsive to determining that the automated object recognition process did not meet the specified reliability metric: means for requesting an additional layer encoding from a network device; and means for searching for the at least one object in the first decoded image portion using the additional layer encoding and the automated object recognition process.

In Example 104, the subject matter of Examples 102-103 includes, wherein the means for searching for the at least one object in the first decoded image portion using the automated object recognition process comprises means for using a deep learning neural network.

In Example 105, the subject matter of Examples 102-104 includes, wherein the means for determining, based upon the automated object recognition process, that errors are present in the first decoded image portion comprises: means for receiving an identification of an object from a communication server; and means for determining that the object cannot be recognized in the first decoded image portion.

In Example 106, the subject matter of Examples 102-105 includes, wherein the means for determining, based upon the automated object recognition process, that errors are present in the first decoded image portion comprises: means for receiving object information from a communication server; means for detecting the object in the first decoded image portion; and means for determining that the object does not match the object information.

In Example 107, the subject matter of Examples 102-106 includes, wherein the means for decoding the first portion of the encoded image to create the first decoded image portion comprises means for using a channel decoder.

In Example 108, the subject matter of Example 107 includes, wherein the channel decoder is one of: a Viterbi decoder or a turbo decoder.

Example 109 is a method of improving decoding performance using predictive feedback information, the method comprising: receiving, encoded communication data encoded with an error correction code, the encoded communication data being communications from a communicating user; identifying predictive feedback information of the communicating user based upon previous communications of the communicating user; creating, using the predictive feedback information, decoding feedback information, the decoding feedback information comprising encoded data that is predictive of communications sent by the communicating user; decoding, by a decoder and using the decoding feedback information, the encoded communication data to produce decoded communication data, the decoding using the decoding feedback information to select one or more of a plurality of probable decodings; and outputting the decoded communication data.

In Example 110, the subject matter of Example 109 includes, wherein the predictive feedback information comprises a word frequency database describing word frequency usage from past communications of the communicating user, and wherein creating the decoding feedback information comprises: identifying a first word and a second word in the word frequency database, the first word having a higher frequency of usage than the second word; encoding the first word and the second word to create a first encoded word and a second encoded word; and creating the decoding feedback information using the first encoded word and the second encoded word and information indicating a frequency of usage of the first encoded word and the second encoded word.

In Example 111, the subject matter of Example 110 includes, wherein identifying the first word and the second word comprises: identifying that the first and second words are within a threshold similarity to each other and: a difference in the frequency of usage of the first word and the second word exceeds a first threshold or the frequency of usage of one of the first word or the second word is below a second threshold and the frequency of usage of the other of the first word or the second word is above a third threshold.

In Example 112, the subject matter of Example 111 includes, wherein identifying the first word comprises identifying the first word in a portion of decoded communication data.

In Example 113, the subject matter of Examples 111-112 includes, wherein the decoded communication data comprises one of: decoded chat data; decoded instant message data; decoded file data; or decoded voice communications.

In Example 114, the subject matter of Examples 109-113 includes, wherein the decoded communication data is a document and wherein a sender of the document is a different person than the communicating user.

In Example 115, the subject matter of Examples 109-114 includes, wherein the encoded communication data is one of: received over a communication medium or retrieved from a storage device.

In Example 116, the subject matter of Examples 109-115 includes, wherein decoding, by the decoder and using the predictive feedback information, the encoded communication data to produce the decoded communication data, the decoding using the decoding feedback information to select one or more of the plurality of probable decodings comprises: adjusting a probability of a decoding result in a turbo decoder based upon the decoding feedback information.

In Example 117, the subject matter of Examples 109-116 includes, wherein decoding, by the decoder and using the predictive feedback information, the encoded communication data to produce the decoded communication data, the decoding using the decoding feedback information to select one or more of the plurality of probable decodings comprises: adjusting a path cost of a trellis-based decoder based upon the decoding feedback information.

Example 118 is a computing device for improving decoding performance using predictive feedback information, the computing device comprising: a hardware processor; a memory, storing instructions, which when executed by the hardware processor, causes the hardware processor to perform operations comprising: receiving, encoded communication data encoded with an error correction code, the encoded communication data being communications from a communicating user; identifying predictive feedback information of the communicating user based upon previous communications of the communicating user; creating, using the predictive feedback information, decoding feedback information, the decoding feedback information comprising encoded data that is predictive of communications sent by the communicating user; decoding, by a decoder and using the decoding feedback information, the encoded communication data to produce decoded communication data, the decoding using the decoding feedback information to select one or more of a plurality of probable decodings; and outputting the decoded communication data.

In Example 119, the subject matter of Example 118 includes, wherein the predictive feedback information comprises a word frequency database describing word frequency usage from past communications of the communicating user, and wherein the operations of creating the decoding feedback information comprises: identifying a first word and a second word in the word frequency database, the first word having a higher frequency of usage than the second word; encoding the first word and the second word to create a first encoded word and a second encoded word; and creating the decoding feedback information using the first encoded word and the second encoded word and information indicating a frequency of usage of the first encoded word and the second encoded word.

In Example 120, the subject matter of Example 119 includes, wherein the operations of identifying the first word and the second word comprises: identifying that the first and second words are within a threshold similarity to each other and: a difference in the frequency of usage of the first word and the second word exceeds a first threshold or the frequency of usage of one of the first word or the second word is below a second threshold and the frequency of usage of the other of the first word or the second word is above a third threshold.

In Example 121, the subject matter of Example 120 includes, wherein the operations of identifying the first word comprises identifying the first word in a portion of decoded communication data.

In Example 122, the subject matter of Examples 120-121 includes, wherein the decoded communication data comprises one of: decoded chat data, decoded instant message data; decoded file data; or decoded voice communications.

In Example 123, the subject matter of Examples 118-122 includes, wherein the decoded communication data is a document and wherein a sender of the document is a different person than the communicating user.

In Example 124, the subject matter of Examples 118-123 includes, wherein the encoded communication data is one of: received over a communication medium or retrieved from a storage device.

In Example 125, the subject matter of Examples 118-124 includes, wherein the operations of decoding, by the decoder and using the predictive feedback information, the encoded communication data to produce the decoded communication data, the decoding using the decoding feedback information to select one or more of the plurality of probable decodings comprises: adjusting a probability of a decoding result in a turbo decoder based upon the decoding feedback information.

In Example 126, the subject matter of Examples 118-125 includes, wherein the operations of decoding, by the decoder and using the predictive feedback information, the encoded communication data to produce the decoded communication data, the decoding using the decoding feedback information to select one or more of the plurality of probable decodings comprises: adjusting a path cost of a trellis-based decoder based upon the decoding feedback information.

Example 127 is a machine-readable medium, storing instructions for improving decoding performance using predictive feedback information, the instructions, when executed by a machine, cause the machine to perform operations comprising: receiving, encoded communication data encoded with an error correction code, the encoded communication data being communications from a communicating user; identifying predictive feedback information of the communicating user based upon previous communications of the communicating user; creating, using the predictive feedback information, decoding feedback information, the decoding feedback information comprising encoded data that is predictive of communications sent by the communicating user; decoding, by a decoder and using the decoding feedback information, the encoded communication data to produce decoded communication data, the decoding using the decoding feedback information to select one or more of a plurality of probable decodings; and outputting the decoded communication data.

In Example 128, the subject matter of Example 127 includes, wherein the predictive feedback information comprises a word frequency database describing word frequency usage from past communications of the communicating user, and wherein the operations of creating the decoding feedback information comprises: identifying a first word and a second word in the word frequency database, the first word having a higher frequency of usage than the second word; encoding the first word and the second word to create a first encoded word and a second encoded word; and creating the decoding feedback information using the first encoded word and the second encoded word and information indicating a frequency of usage of the first encoded word and the second encoded word.

In Example 129, the subject matter of Example 128 includes, wherein the operations of identifying the first word and the second word comprises: identifying that the first and second words are within a threshold similarity to each other and: a difference in the frequency of usage of the first word and the second word exceeds a first threshold or the frequency of usage of one of the first word or the second word is below a second threshold and the frequency of usage of the other of the first word or the second word is above a third threshold.

In Example 130, the subject matter of Example 129 includes, wherein the operations of identifying the first word comprises identifying the first word in a portion of decoded communication data.

In Example 131, the subject matter of Examples 129-130 includes, wherein the decoded communication data comprises one of: decoded chat data; decoded instant message data; decoded file data; or decoded voice communications.

In Example 132, the subject matter of Examples 127-131 includes, wherein the decoded communication data is a document and wherein a sender of the document is a different person than the communicating user.

In Example 133, the subject matter of Examples 127-132 includes, wherein the encoded communication data is one of: received over a communication medium or retrieved from a storage device.

In Example 134, the subject matter of Examples 127-133 includes, wherein the operations of decoding, by the decoder and using the predictive feedback information, the encoded communication data to produce the decoded communication data, the decoding using the decoding feedback information to select one or more of the plurality of probable decodings comprises: adjusting a probability of a decoding result in a turbo decoder based upon the decoding feedback information.

In Example 135, the subject matter of Examples 127-134 includes, wherein the operations of decoding, by the decoder and using the predictive feedback information, the encoded communication data to produce the decoded communication data, the decoding using the decoding feedback information to select one or more of the plurality of probable decodings comprises: adjusting a path cost of a trellis-based decoder based upon the decoding feedback information.

Example 136 is a device for improving decoding performance using predictive feedback information, the device comprising: means for receiving, encoded communication data encoded with an error correction code, the encoded communication data being communications from a communicating user; means for identifying predictive feedback information of the communicating user based upon previous communications of the communicating user; means for creating, using the predictive feedback information, decoding feedback information, the decoding feedback information comprising encoded data that is predictive of communications sent by the communicating user; means for decoding, by a decoder and using the decoding feedback information, the encoded communication data to produce decoded communication data, the decoding using the decoding feedback information to select one or more of a plurality of probable decodings; and means for outputting the decoded communication data.

In Example 137, the subject matter of Example 136 includes, wherein the predictive feedback information comprises a word frequency database describing word frequency usage from past communications of the communicating user, and wherein the means for creating the decoding feedback information comprises: means for identifying a first word and a second word in the word frequency database, the first word having a higher frequency of usage than the second word; means for encoding the first word and the second word to create a first encoded word and a second encoded word; and means for creating the decoding feedback information using the first encoded word and the second encoded word and information indicating a frequency of usage of the first encoded word and the second encoded word.

In Example 138, the subject matter of Example 137 includes, wherein the means for identifying the first word and the second word comprises: means for identifying that the first and second words are within a threshold similarity to each other and: a difference in the frequency of usage of the first word and the second word exceeds a first threshold or the frequency of usage of one of the first word or the second word is below a second threshold and the frequency of usage of the other of the first word or the second word is above a third threshold.

In Example 139, the subject matter of Example 138 includes, wherein the means for identifying the first word comprises means for identifying the first word in a portion of decoded communication data.

In Example 140, the subject matter of Examples 138-139 includes, wherein the decoded communication data comprises one of: decoded chat data, decoded instant message data; decoded file data; or decoded voice communications.

In Example 141, the subject matter of Examples 136-140 includes, wherein the decoded communication data is a document and wherein a sender of the document is a different person than the communicating user.

In Example 142, the subject matter of Examples 136-141 includes, wherein the encoded communication data is one of: received over a communication medium or retrieved from a storage device.

In Example 143, the subject matter of Examples 136-142 includes, wherein the means for decoding, by the decoder and using the predictive feedback information, the encoded communication data to produce the decoded communication data, the decoding using the decoding feedback information to select one or more of the plurality of probable decodings comprises: means for adjusting a probability of a decoding result in a turbo decoder based upon the decoding feedback information.

In Example 144, the subject matter of Examples 136-143 includes, wherein the means for decoding, by the decoder and using the predictive feedback information, the encoded communication data to produce the decoded communication data, the decoding using the decoding feedback information to select one or more of the plurality of probable decodings comprises: means for adjusting a path cost of a trellis-based decoder based upon the decoding feedback information.

Example 145 is at least one machine-readable medium including instructions that, when executed by processing circuitry, cause the processing circuitry to perform operations to implement of any of Examples 1-144.

Example 146 is an apparatus comprising means to implement of any of Examples 1-144.

Example 147 is a system to implement of any of Examples 1-144.

Example 148 is a method to implement of any of Examples 1-144.

What is claimed is:

1. A method for improving decoding performance of an image using object detection, the method comprising:
   receiving an encoded image;
   decoding a first portion of the encoded image using a decoder to create a first decoded image portion;
   searching for at least one object in the first decoded image portion using an automated object recognition process;
   determining, based upon the automated object recognition process, that an error is present in the first decoded image portion, and, in response:
   correcting the first decoded image portion based upon the automated object recognition process to produce a corrected decoded image;
   encoding the corrected decoded image to create a corrected encoded image;
   decoding a second portion of the encoded image to create a second corrected decoded image, during the decoding, modifying at least one parameter of the decoder using the corrected encoded image, the parameter of the decoder comprising one of: a path cost, a trellis, or a probability; and
   outputting the second corrected decoded image to a display device.

2. The method of claim 1, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the method further comprises:
   determining that the automated object recognition process did not meet a specified reliability metric; and
   responsive to determining that the automated object recognition process did not meet the specified reliability metric:
   requesting an additional layer encoding from a network device; and
   searching for the at least one object in the first decoded image portion using the additional layer encoding and the automated object recognition process.

3. The method of claim 1, wherein performing the automated object recognition process comprises uses a deep learning neural network.

4. The method of claim 1, wherein determining, based upon the automated object recognition process, that errors are present in the first decoded image portion comprises:
   receiving an identification of an object from a communication server; and
   determining that the object cannot be recognized in the first decoded image portion.

5. The method of claim 1, wherein determining, based upon the automated object recognition process, that errors are present in the first decoded image portion comprises:
   receiving object information from a communication server;
   detecting the object in the first decoded image portion; and
   determining that the object does not match the object information.

6. The method of claim 1, wherein decoding the first portion of the encoded image to create the first decoded image portion comprises using a channel decoder.

7. The method of claim 6, wherein the channel decoder is one of: a Viterbi decoder or a turbo decoder.

8. A computing device for improving decoding performance of an image using object detection, the computing device comprising:
   a hardware processor;
   a memory, the memory storing instructions, which when executed by the hardware processor, causes the computing device to perform operations comprising:
   receiving an encoded image;
   decoding a first portion of the encoded image using a decoder to create a first decoded image portion;
   searching for at least one object in the first decoded image portion using an automated object recognition process;
   determining, based upon the automated object recognition process, that an error is present in the first decoded image portion, and, in response:
   correcting the first decoded image portion based upon the automated object recognition process to produce a corrected decoded image;
   encoding the corrected decoded image to create a corrected encoded image;
   decoding a second portion of the encoded image to create a second corrected decoded image, during the decoding, modifying at least one parameter of the decoder using the corrected encoded image, the parameter of the decoder comprising one of: a path cost, a trellis, or a probability; and
   outputting the second corrected decoded image to a display device.

9. The computing device of claim 8, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the operations further comprise:
   determining that the automated object recognition process did not meet a specified reliability metric; and
   responsive to determining that the automated object recognition process did not meet the specified reliability metric:
   requesting an additional layer encoding from a network device; and
   searching for the at least one object in the first decoded image portion using the additional layer encoding and the automated object recognition process.

10. The computing device of claim 8, wherein the operations of performing the automated object recognition process comprises uses a deep learning neural network.

11. The computing device of claim 8, wherein the operations of determining, based upon the automated object recognition process, that errors are present in the first decoded image portion comprises:
    receiving an identification of an object from a communication server; and
    determining that the object cannot be recognized in the first decoded image portion.

12. The computing device of claim 8, wherein the operations of determining, based upon the automated object recognition process, that errors are present in the first decoded image portion comprises:
- receiving object information from a communication server;
- detecting the object in the first decoded image portion; and
- determining that the object does not match the object information.

13. The computing device of claim 8, wherein the operations of decoding the first portion of the encoded image to create the first decoded image portion comprises using a channel decoder.

14. The computing device of claim 13, wherein the channel decoder is one of: a Viterbi decoder or a turbo decoder.

15. A machine-readable storage device, storing instructions for improving decoding performance of an image using object detection, the instructions, when executed by a machine, cause the machine to perform operations comprising:
- receiving an encoded image;
- decoding a first portion of the encoded image using a decoder to create a first decoded image portion;
- searching for at least one object in the first decoded image portion using an automated object recognition process;
- determining, based upon the automated object recognition process, that an error is present in the first decoded image portion, and, in response:
- correcting the first decoded image portion based upon the automated object recognition process to produce a corrected decoded image;
- encoding the corrected decoded image to create a corrected encoded image;
- decoding a second portion of the encoded image to create a second corrected decoded image, during the decoding, modifying at least one parameter of the decoder using the corrected encoded image, the parameter of the decoder comprising one of: a path cost, a trellis, or a probability; and
- outputting the second corrected decoded image to a display device.

16. The machine-readable storage device of claim 15, wherein the encoded image includes only a base layer encoding that encodes a first quality, size, or bitrate, wherein additional layer encodings provide additional information used to increase the size, quality, or bitrate of a decoded video over the first quality, size, or bitrate respectively, and wherein the operations further comprise:
- determining that the automated object recognition process did not meet a specified reliability metric; and
- responsive to determining that the automated object recognition process did not meet the specified reliability metric:
- requesting an additional layer encoding from a network device; and
- searching for the at least one object in the first decoded image portion using the additional layer encoding and the automated object recognition process.

17. The machine-readable storage device of claim 15, wherein the operations of performing the automated object recognition process comprises uses a deep learning neural network.

18. The machine-readable storage device of claim 15, wherein the operations of determining, based upon the automated object recognition process, that errors are present in the first decoded image portion comprises:
- receiving an identification of an object from a communication server; and
- determining that the object cannot be recognized in the first decoded image portion.

19. The machine-readable storage device medium of claim 15, wherein the operations of determining, based upon the automated object recognition process, that errors are present in the first decoded image portion comprises:
- receiving object information from a communication server;
- detecting the object in the first decoded image portion; and
- determining that the object does not match the object information.

20. The machine-readable storage device of claim 15, wherein the operations of decoding the first portion of the encoded image to create the first decoded image portion comprises using a channel decoder.

* * * * *